United States Patent
Kasajima et al.

(10) Patent No.: US 7,960,970 B2
(45) Date of Patent: Jun. 14, 2011

(54) MAGNETIC SENSOR AND MANUFACTURING METHOD OF THE SAME

(75) Inventors: Tamon Kasajima, Hong Kong (CN); Shigeru Shoji, Tokyo (JP)

(73) Assignees: SAE Magnetics (H.K.) Ltd., Hong Kong (CN); TDK Corporation, Tokyo (JP)

( * ) Notice: Subject to any disclaimer, the term of this patent is extended or adjusted under 35 U.S.C. 154(b) by 398 days.

(21) Appl. No.: 12/222,380

(22) Filed: Aug. 7, 2008

(65) Prior Publication Data

US 2009/0045809 A1 Feb. 19, 2009

(30) Foreign Application Priority Data

Aug. 14, 2007 (JP) ................. 2007-211201

(51) Int. Cl.
*G01R 33/04* (2006.01)
(52) U.S. Cl. ........................... 324/252; 324/249
(58) Field of Classification Search .................. None
See application file for complete search history.

(56) References Cited

U.S. PATENT DOCUMENTS

| | | | |
|---|---|---|---|
| 6,184,680 B1 * | 2/2001 | Shinoura et al. | 324/252 |
| 2008/0238417 A1 * | 10/2008 | Suzuki | 324/228 |

FOREIGN PATENT DOCUMENTS

| JP | 2003-106866 | | 4/2003 |
|---|---|---|---|
| JP | 2006-98088 | | 4/2006 |
| JP | 2008249369 A | * | 10/2008 |
| JP | 2008249371 A | * | 10/2008 |

\* cited by examiner

*Primary Examiner* — Minh N Tang
(74) *Attorney, Agent, or Firm* — Nixon & Vanderhye

(57) ABSTRACT

A magnetic sensor having a reduced size and cost is provided. More particularly, the magnetic sensor includes a magnetic field detection chip having a magnetic field detection element for detecting a magnetic field and an output terminal for outputting an output signal from the magnetic field detection element. A substrate has the magnetic field detection chip mounted thereon, and has a connection terminal for being connected to the output terminal of the magnetic field detection chip that is formed on a mount face of the substrate. An output-terminal formed face of the magnetic field detection chip is arranged non-parallel to the mount face of the substrate. More specifically, the output-terminal formed face of the magnetic field detection chip is arranged almost vertical to the mount face of the substrate.

25 Claims, 23 Drawing Sheets

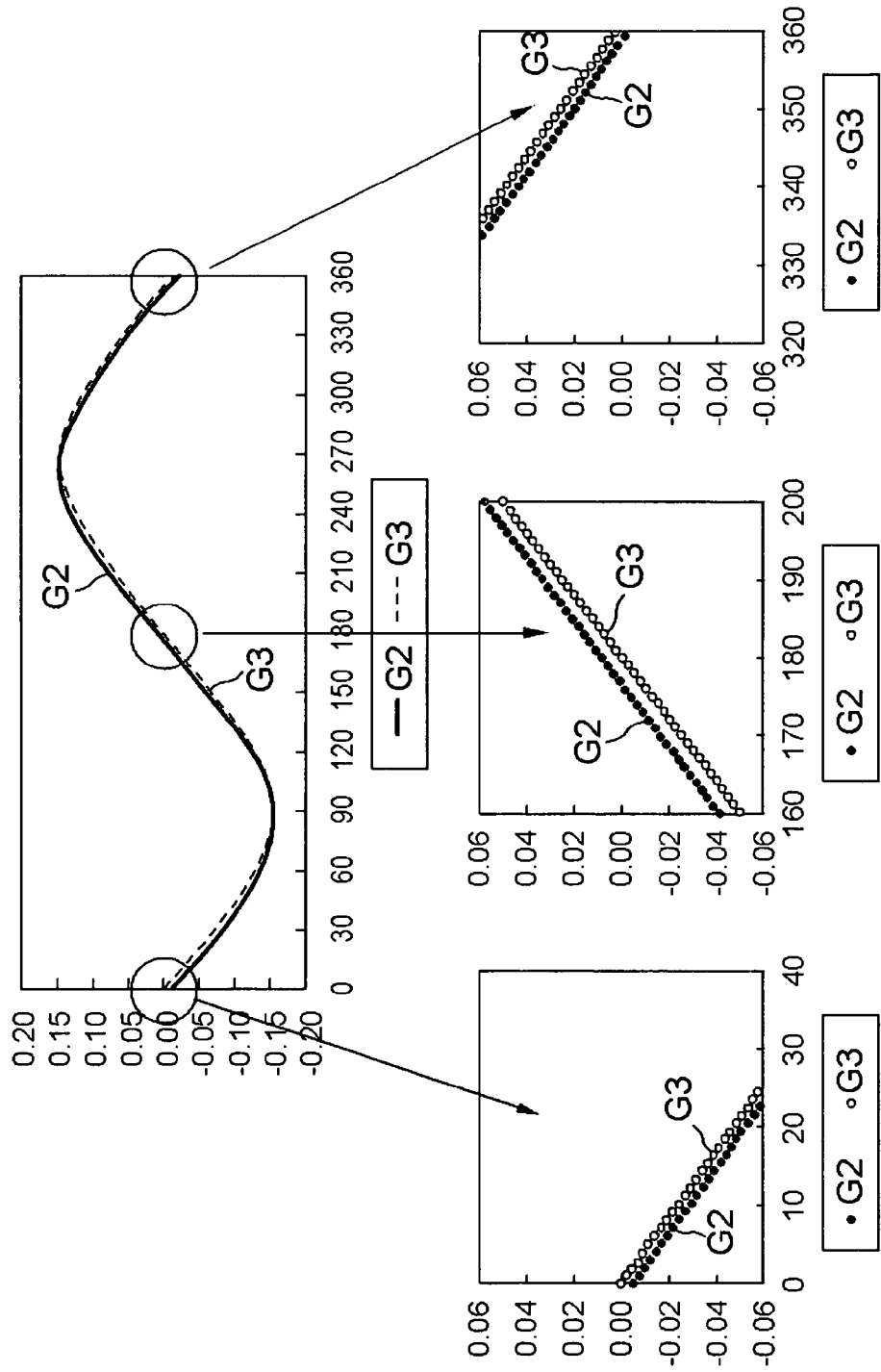

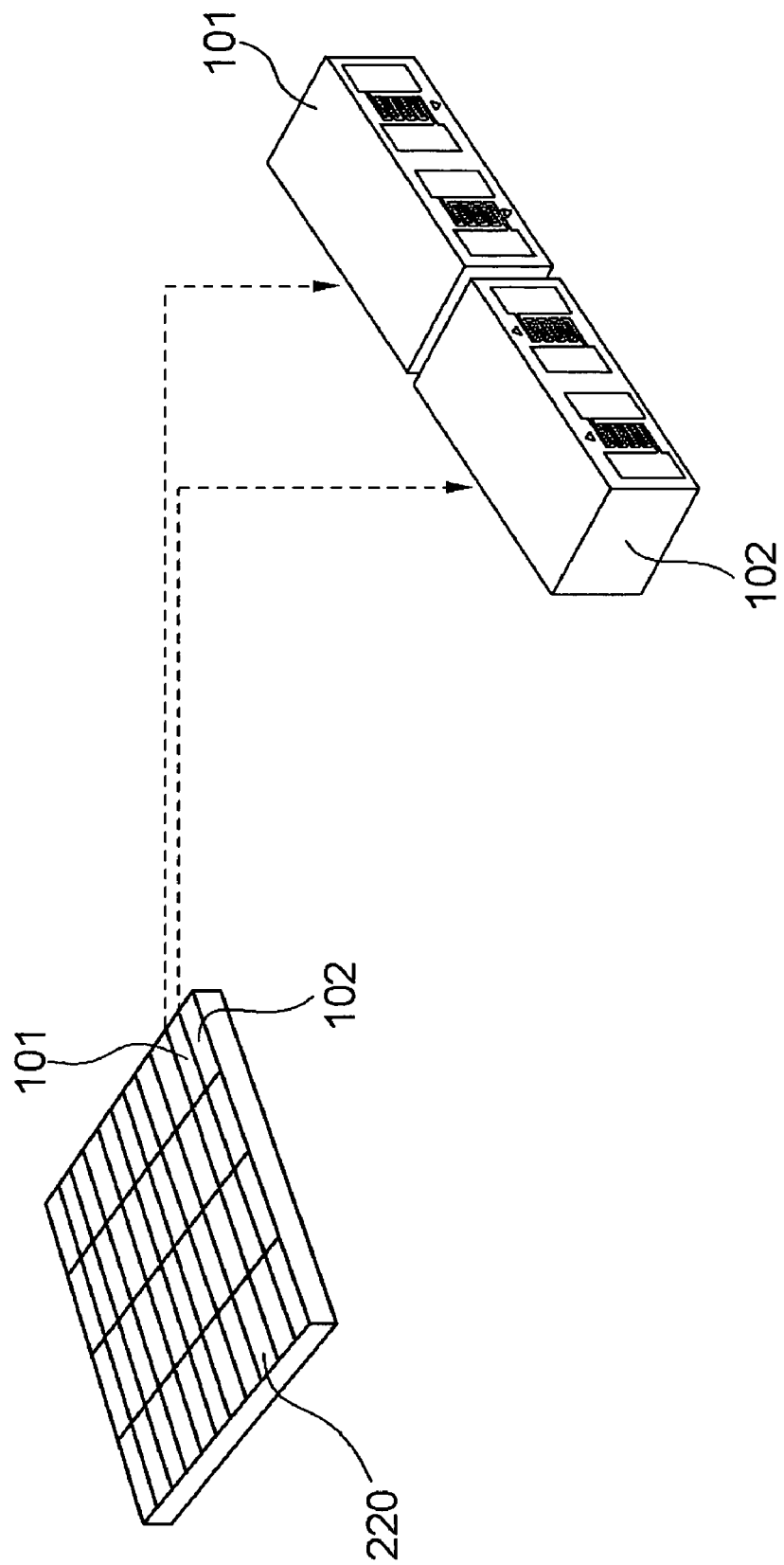

MAGNETIC SENSOR AND MANUFACTURING METHOD OF THE SAME

This applications claims priority to Japanese Application No. 2007-211201 filed Aug. 14, 2007, the entire contents of which are hereby incorporated by reference.

BACKGROUND OF THE INVENTION

1. Field of the Invention

The present invention relates to a magnetic sensor capable of detecting changes in a magnetic field.

2. Description of the Related Art

A magnetic sensor capable of detecting changes in a magnetic field has been developed as a measuring device, and it is used for various applications such as a magnetic encoder, an open/close switch, an azimuth sensor, for example. Examples of such magnetic sensors are disclosed in Patent Documents 1 and 2 described below. The sensors depicted in those Patent Documents use GMR elements (giant magnetoresistive elements) as the elements for detecting the changes in the magnetic field. The GMR element is an element whose resistance value to be outputted changes in accordance with inputted magnetism. Thus, it is possible with the GMR element to measure a change in the detected magnetic field based on the outputted resistance values.

As an example of a specific structure of a magnetic sensor using the GMR elements, first, four GMR elements are placed on a substrate to constitute a bridge circuit. Then, a differential voltage of the bridge circuit is detected so as to detect a change in resistance values of the GMR elements caused due to a change in the magnetic field as a detection target. This makes it possible to constitute a sensor that is highly sensitive to changes in the magnetic field.

Now, a structural example of the magnetic sensor of the conventional case described above will be described by referring to FIG. 1-FIG. 7. First, FIG. 1A shows a GMR chip 501. As shown in this drawing, a GMR element 511 and a pair of output terminals 512 for outputting output signals from the GMR element 511 are laminated/formed on one face (top face in FIG. 1A) of the GMR chip 501. Then, the GMR chip 501 is mounted on a substrate by having the face with the GMR element 511 facing upwards, and the top face side is sealed with an insulating member 504 such as a resin to be formed into a package. With this, a magnetic sensor 510 as in FIG. 1B is constituted. As shown in this drawing, the GMR chip 501 is provided by having its face with the GMR element 511 facing upwards. Thus, it comes to have a detection sensitivity for the magnetic field in a direction in parallel to the top face of the GMR chip 501 indicated by a reference numeral 504, i.e., in a vertical direction with respect to the side face. Specifically, as shown in FIG. 2, output of the resistance value of the GMR element changes in a sine waveform when a magnetic field A that is in parallel to the top face of the GMR chip 501 changes in a direction of an arrow Y as in a magnetic field A'. With this, changes in the magnetic field can be detected.

Next, an example of magnetic sensor manufacturing method according to the aforementioned conventional case will be described. As shown in FIG. 3A, it is to be understood that the magnetic sensor described herein comprises a substrate 502, the GMR chips 501, and an operational amplifier 505. First, as shown in FIG. 3B, each of the chips, i.e., the operational amplifier 505 and the GMR chips 501, is placed on the substrate 502. At this time, the GMR chips 501 are placed by having the GMR element face and the output terminals facing upwards, i.e., placed in parallel with and by facing the same direction as the a mount face of the substrate.

Subsequently, as shown in FIG. 4A, the output terminals formed on the top faces of the GMR chips 501 and connection terminals formed on the substrate 502 are connected by wire bonding. At the same time, terminals formed on the top-face side of the operational amplifier 505 and the connection terminals on the substrate 502 are connected by wire bonding. FIG. 4B shows an illustration of the wire-bonded substrate 502 viewed from the above. Thereafter, as shown in FIG. 5A and FIG. 5B, the insulating member 504 such as a resin is placed on the top face side of the substrate 502 for forming it into a package as a magnetic sensor. FIG. 6A and FIG. 6B show schematic illustrations of a structure when the GMR chip 501 is mounted on the substrate 502, and the terminals thereof are connected by wire bonding. Specifically, FIG. 6A is an illustration viewed from the above, and FIG. 6B shows an illustration when viewed from the side.

Patent Document 1: Japanese Unexamined Patent Publication 2003-106866

Patent Document 2: Japanese Unexamined Patent Publication 2006-98088

However, with the magnetic sensor of the above-described structure, it is necessary to connect the output terminals 512 formed on the GMR chip 501 with the connection terminals 521 formed on the substrate 502 by wire bonding. Thus, it is necessary to provide a space for a wire 513, which may result in having such a problem that the magnetic sensor itself cannot be reduced in size. Specifically, as shown in FIG. 6A, it becomes necessary to provide a distance d for the wire between the GMR chip 501 and the connection terminals 521 on the substrate 502. Further, as shown in FIG. 6B, the wire 513 is to be located at a position higher than the top face of the GMR chip 501. That is, height h and the area cannot be reduced when the GMR chip 501 is mounted, so that it is difficult to reduce the size of the magnetic sensor.

Further, as shown in FIG. 7, there is a GGI method in which the output terminal of the GMR chip 501 is placed to face the substrate 502, and a gold ball 503 is interposed between the output terminal and the connection terminal 521 on the substrate 502. However, the magnetic sensor is also formed higher for the height of the gold ball 503 (code h'), so that there still remains the issue that the magnetic sensor cannot be reduced in size.

SUMMARY OF THE INVENTION

It is therefore an object of the present invention to improve the foregoing inconveniences and, in particular, to provide a magnetic sensor that can be reduced in size and cost by improving the manufacture efficiency.

Thus, a magnetic sensor according to one aspect of the present invention employs a structure which comprises: a magnetic field detection chip having a magnetic field detection element for detecting a magnetic field and an output terminal for outputting an output signal from the magnetic field detection element; and a substrate that has the magnetic field detection chip mounted thereon, and has a connection terminal for being connected to the output terminal of the magnetic field detection chip that is formed on a mount face of the substrate, wherein the magnetic field detection chip is mounted on the substrate in such a manner that an output-terminal formed face of the magnetic field detection chip does not become in parallel to the mount face of the substrate.

With the present invention described above, the magnetic sensor is formed by mounting the magnetic field detection chip having the magnetic field detection element formed on the substrate. More specifically, the output-terminal formed face of the magnetic detection chip is arranged so as not be in parallel to the mount face of the substrate. Thus, the output terminal of the magnetic field detection chip is arranged not to face towards the height direction of the magnetic sensor when the magnetic field detection chip is stacked on the substrate. Accordingly, when the output terminal of the magnetic field detection chip and the connection terminal of the substrate are connected, the connected part in the output terminal is not to be formed in the height direction of the magnetic sensor. Therefore, it is possible to suppress an increase in the height of the sensor, thereby making it possible to reduce the size.

In addition to the above-described structure, by arranging the output-terminal formed face of the magnetic field detection chip to be almost vertical to the mount face of the substrate, i.e., by arranging the output terminal to be located on the side-face side of the magnetic field detection chip, the distance between the output terminal and the connection terminal of the substrate to be connected mutually can be made closer. This makes it easy to connect those terminals, which results in simplifying the manufacture and reducing the cost.

Further, the present invention employs such a structure that the magnetic field detection chip has a magnetic field detection element formed on the output-terminal formed face of the magnetic field detection chip. Thus, it is possible to constitute the magnetic field detection chip by laminating/forming the magnetic field detection element and the output terminal only on a prescribed single face of the magnetic field detection chip. It is possible even with such structure to detect the magnetic field that is in parallel to the formed face of the magnetic field detection element, and such structure can function as a magnetic sensor. This makes it possible to simplify the manufacture of the magnetic sensor.

Further, the present invention employs such a structure that the magnetic field detection chip is mounted by being abutted against the substrate. Here, the magnetic field detection chip is mounted on the substrate in such a manner that the output terminal and the connection terminal are located closely from each other. Furthermore, the present invention employs such a structure that the output terminal and the connection terminals are connected by ball bonding. With this, one face of the magnetic field detection chip can be mounted by being abutted against the substrate, so that it can be mounted stably. At the same time, the magnetic field detection chip and the substrate can be arranged still closer. Thus, the distance between the output terminal and the connection terminal becomes still shorter, so that connection of those terminals becomes easy. Specifically, those terminals can be connected by ball bonding using gold balls or solder balls. Therefore, manufacture of the magnetic sensors becomes still easier, and the manufacturing cost can be reduced as well.

Further, the present invention employs such a structure that the magnetic field detection element is a spin-valve type magnetoresistive element. With this, it becomes possible to constitute the magnetic sensor that is capable of detecting the changes in the direction of the magnetic field with high accuracy.

Furthermore, the present invention employs such a structure that the magnetic sensor comprises a bridge circuit formed by connecting a plurality of the magnetic field detection elements that are magnetoresistive elements, and a differential voltage detecting device for detecting a differential voltage in the bridge circuit. Here, the present invention employs such a structure that the magnetic field detection chips are mounted on the substrate in such a manner that a plurality of magnetic field detection chips each having the magnetic field detection element for forming the bridge circuit are arranged in a straight line form. Furthermore, the present invention employs such a structure that the magnetic field detection chips are mounted on the substrate in such a manner that the plurality of magnetic field detection elements for forming the bridge circuit are located on a same plane. Moreover, the present invention employs such a structure that the magnetic field detection chips are mounted on the substrate in such a manner that formed faces of each of the magnetic field detection elements connected in pairs to detect the differential voltage in the bridge circuit are to face in the directions rotated by 180 degrees from each other along the formed faces. Here, the present invention further employs such a structure that the magnetic field detection chips are mounted on the substrate in such a manner that the formed faces of each of the magnetic field detection elements connected in pairs to detect the differential voltage in the bridge circuit are to face in the opposite directions from each other.

With this, the resistance value of the magnetic field detection element, which changes in accordance with the change in the magnetic field, can be detected from the differential voltage of the bridge circuit. Thus, the change in the magnetic field can be detected with still higher accuracy. Further, by rotating one of the formed faces of the magnetic field detection elements in pairs that are connected in series or in parallel for detecting the differential voltage by 180 degrees with respect to the other formed face and, in addition, by placing one face with its front and back sides inverted from those of the other formed face, shift in the magnetization fixed directions that may be generated when manufacturing each element, i.e., shift in the magnetization directions of the pin layers, can be offset mutually. Therefore, it becomes possible to detect the change in the magnetic field with high accuracy by eliminating the influences of the shift. Further, even with such layout, the GMR chips can be arranged side by side on one face of the substrate, so that the space of the sensor can be saved. Further, through arranging the element-formed faces of the magnetic field detection chips on a same plane, it becomes possible for each element to detect the change in the magnetic field under almost a same condition. Therefore, the detection accuracy can be improved. Furthermore, by using the plurality of magnetic detection elements that are formed on a same base body where a plurality of the magnetic field detection elements are formed at the time of manufacture and, further, by using those formed closely on the base body, shift in the direction of the pin magnetic field generated in each element at a manufacture process becomes small. Therefore, it is possible to improve the detection accuracy further.

Further, a magnetic sensor manufacturing method as another aspect of the present invention employs a structure that comprises: a magnetic field detection chip manufacturing step which laminates/forms a magnetic field detection element for detecting a magnetic field and an output terminal for outputting an output signal from the magnetic field detection element on a base body, and cuts out a magnetic field detection chip having the magnetic field detection element and the output terminal from the base body; a magnetic field detection chip mounting step which mounts the magnetic field detection chip on a mount face of a substrate where a connection terminal is formed, and connects the output terminal and the connection terminal electrically; and a packaging step which covers, with an insulating member, the mount face side of the substrate on which the magnetic field detection chip is mounted, wherein the magnetic field detection chip mounting step mounts the magnetic field detection chip on the substrate in such a manner that an output-terminal formed face of the magnetic field detection chip does not become in parallel to the mount face of the substrate.

Further, the present invention employs such a structure that the magnetic field detection chip mounting step mounts the magnetic field detection chip on the substrate in such a manner that the output-terminal formed face of the magnetic field detection chip becomes almost vertical to the mount face of the substrate. Furthermore, the magnetic field detection chip mounting step mounts the magnetic field detection chip on the substrate by arranging the output terminal and the connection terminal closely from each other. Here, the magnetic field detection chip mounting step connects the output terminal and the connection terminal by ball bonding.

Further, the present invention employs such a structure that the magnetic field detection chip mounting step forms a bridge circuit capable of detecting a differential voltage, by connecting a plurality of the magnetic field detection elements that are magnetoresistive elements. Here, the magnetic field detection chip mounting step mounts the magnetic field detection chips on the substrate in such a manner that a plurality of magnetic field detection chips each having the magnetic field detection element for forming the bridge circuit are arranged in a straight line form. Further, the magnetic field detection chip mounting step mounts the magnetic field detection chips on the substrate in such a manner that the plurality of magnetic field detection elements for forming the bridge circuit are located on a same plane. Furthermore, the magnetic field detection chip mounting step mounts the magnetic field detection chips on the substrate in such a manner that formed faces of each of the magnetic field detection elements connected in pairs to detect the differential voltage in the bridge circuit are to face in directions rotated by 180 degrees from each other along the formed faces. Moreover, the magnetic field detection chip mounting step mounts the magnetic field detection chips on the substrate in such a manner that the formed faces of each of the magnetic field detection elements connected in pairs to detect the differential voltage in the bridge circuit are to face in opposite directions from each other. Here, the magnetic field detection chip mounting step forms the bridge circuit by using the plurality of magnetic field detection elements that are formed on the same base body in the magnetic field detection chip manufacturing step and, further, by using the plurality of magnetic field detection elements that are formed closely on the same base body in the magnetic field detection chip manufacturing step.

As in the above, it is possible to provide the magnetic sensor that can be reduced in size and cost by manufacturing the magnetic sensor through the above-described manufacturing method.

The present invention is structured and functions in the manner described above. With the present invention, it is possible to manufacture the magnetic sensor by having the output terminal of the magnetic field detection chip arranged not to face in the height direction of the magnetic sensor when the magnetic field detection chip is mounted on the substrate. Thus, when the output terminal of the magnetic field detection chip and the connection terminal of the substrate are connected, the connected part in the output terminal is not formed in the height direction of the magnetic sensor. Therefore, it is possible to suppress an increase in the height of the sensor. Further, since the distance between the terminals connected between the magnetic field detection chip and the substrate can be made closer, it is possible to reduce the mount area and to simplify the connection thereof. As described above, the present invention can achieve such excellent effects that the size of the magnetic sensor itself can be reduced and the cost of the products can be reduced by simplifying the manufacture process and improving the efficiency thereof, which have not bee achieved conventionally.

BRIEF DESCRIPTION OF THE DRAWINGS

FIG. 18 is an illustration for making a comparison between differential voltages in the layout of the GMR chips disclosed in FIG. 16A and FIG. 17A;

FIG. 22 is an illustration showing an example when selecting the GMR chips that are used for the magnetic sensor according to the second embodiment.

DETAILED DESCRIPTION OF THE PREFERRED EMBODIMENTS

In a magnetic sensor according to the present invention, a terminal face of a magnetic field detection chip that is mounted on a substrate is placed not in parallel to a mount face of the substrate but placed almost vertically to that face, for example. Hereinafter, a specific structure of the magnetic sensor will be described in a form of preferred embodiments.

First Embodiment

Figure 8:
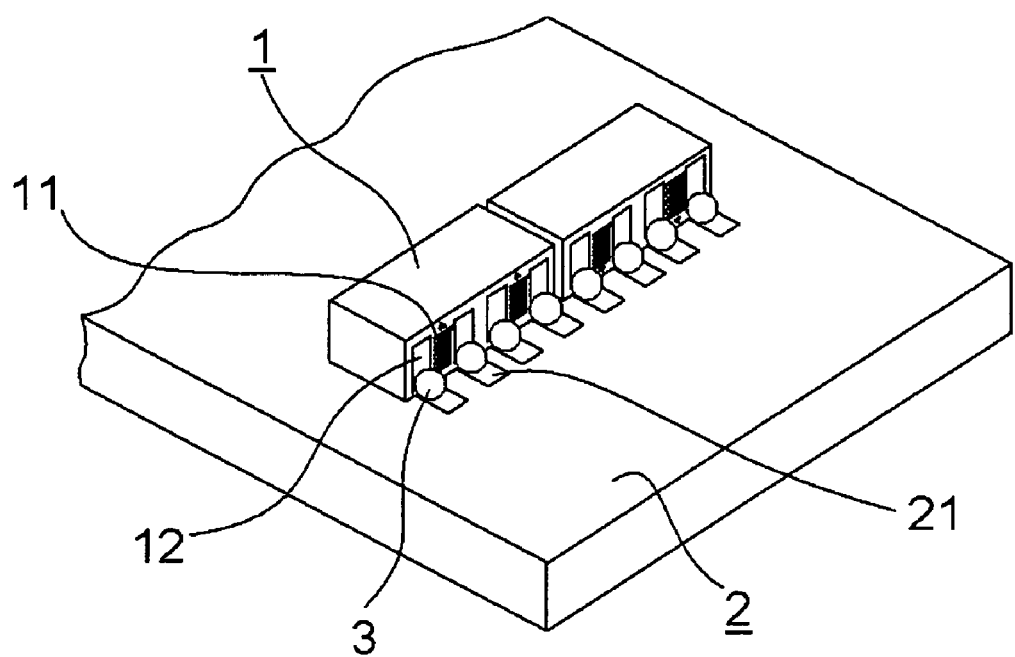
FIG. 8 is a perspective view showing a schematic structure of a magnetic sensor according to a first embodiment.
Figure 10A:
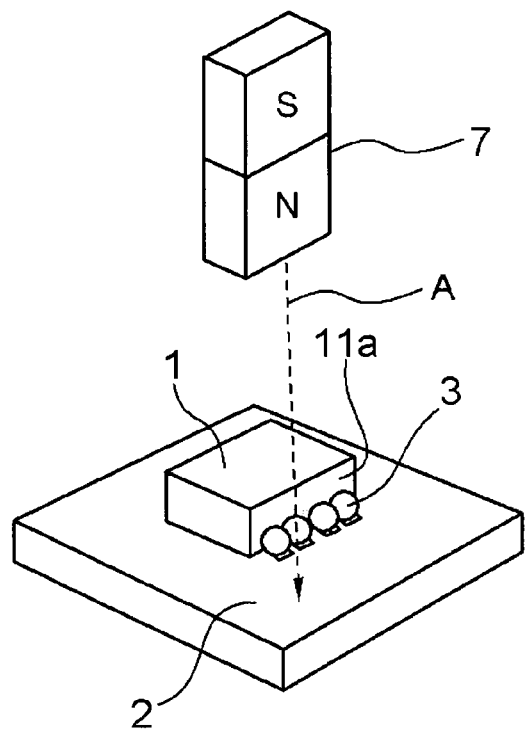
FIG. 10A is an illustration for describing a use state of the magnetic sensor that is disclosed in FIG. 8.
Figure 10B:
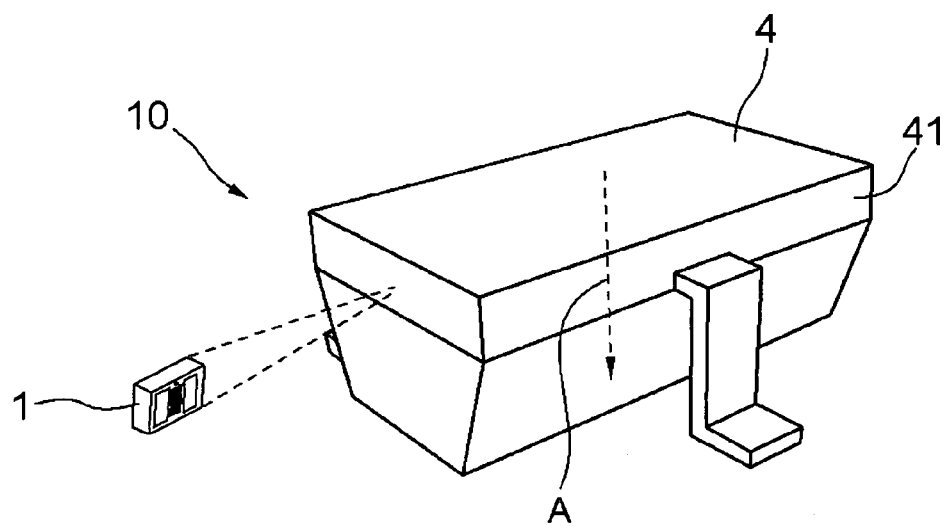
FIG. 10B is an illustration for describing a use state of the magnetic sensor that is disclosed in FIG. 8.
Figure 11:
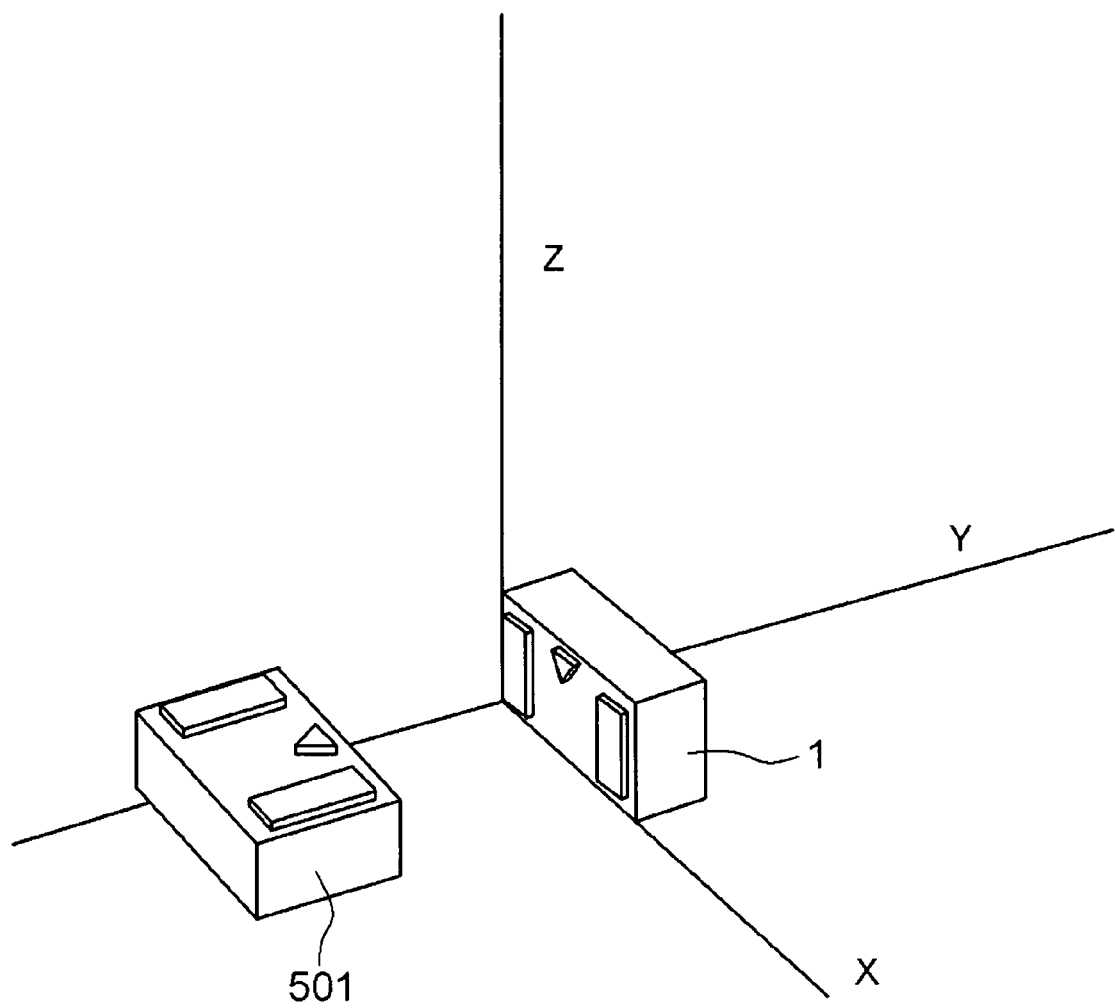
FIG. 11 is an illustration for describing sensitivity directions when detecting a magnetic field by the GMR chips.

A first embodiment of the present invention will be described by referring to FIG. 8-FIG. 11. FIG. 8 and FIG. 9 are illustrations showing a schematic structure of the magnetic sensor according to the first embodiment, and FIG. 10 provides illustrations showing a state of the magnetic sensor in use. FIG. 11 is an illustration for describing facing directions of GMR chips.

First, the magnetic sensor according to the embodiment comprises a GMR chip 1 (magnetic field detection chip) using, as an element for detecting a change in a magnetic field, a spin-valve type GMR element (giant magnetoresistive element) whose resistance value to be outputted changes in accordance with the direction of inputted magnetic field. Specifically, as shown in FIG. 8, the GMR chip 1 is substantially in a cuboid shape. A GMR element 11 having magnetization fixed in a prescribed direction so as to be able to detect the magnetic field in a prescribed direction and a pair of output terminals for outputting the resistance value as an output signal outputted from the GMR element 11 are formed on one face of the GMR chip 1. In the case shown in FIG. 8, there are two sets, each having a single GMR element 11 and a pair of output terminals 12, formed on a single GMR chip 1. However, a single set of the GMR element 11 and the pair of output terminals 12 may be formed on a single GMR chip 1, or three sets or more of the GMR element 11 and the pair of output terminals 12 may be formed on a single GMR chip 1. Further, while there are two GMR chips 1 described above arranged side by side in the case shown in FIG. 8, the number of the GMR chips 1 mounted on the substrate 2 is not limited to that, as will be described later.

The magnetic sensor is formed by mounting the above-described GMR chips 1 on the substrate 2. Connection terminals (in the same number as that of the output terminals 12) to be connected to the output terminals 12 formed on the above-described GMR chips 1 are formed on the mount face of the substrate 2, by corresponding to the layout of each output terminal 12. For example, in the case of FIG. 8, eight connection terminals are formed and arranged in a straight line form.

Now, the facing direction of the GMR chips 1 when mounted on the substrate 2 will be described. As shown in FIG. 8, the GMR chips 1 are arranged on the substrate 2 in such a manner that the face where the output terminals 12 and the GMR element 11 are formed comes in a direction that is almost vertical to the mount face of the substrate 2. At this time, each of the output terminals 12 of the GMR chips 1 is arranged to come close mutually to respective connection terminals 21 formed on the substrate 2. Thereby, as illustrated in a side view shown in FIG. 9B, the output terminal 12 of the GMR chip 1 and the connection terminal 21 of the substrate 2 are located at an almost right angle, even though there is a slight space provided therebetween. Further, the connection terminals 12 of the GMR chip 1 and the connection terminals 21 formed on the substrate 2, which are arranged close to each other, are connected physically and electrically with solder balls 3 that are placed therebetween.

Figure 9A:
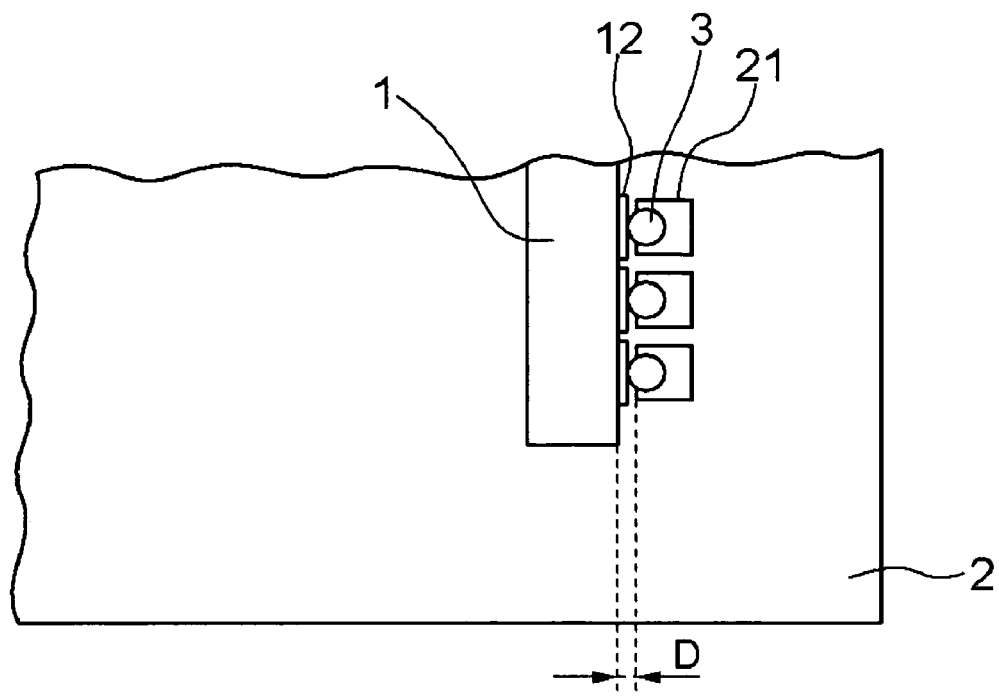
FIG. 9A is a top plan view of the magnetic sensor that is disclosed in FIG. 8.

At this time, the GMR chip 1 is mounted on the mount face of the substrate 2, while having one face of the GMR chip 1 (i.e., the face neighboring to the GMR-element formed face) abutted against the mount face of the substrate 2. With this, the GMR chip 1 can be stably mounted on the substrate 2. Further, since the GMR chip 1 and the substrate 2 can be arranged to be still closer to each other, the distance between the output terminal 12 of the GMR chip 1 and the connection terminal 21 of the substrate 2 arranged at almost right angle as described above also come to be located still closer to each other, as shown in FIG. 9A. Therefore, it becomes easier to connect those terminals. Further, it is possible to connect the terminals through ball bonding by using gold balls, solder balls, or the like. Thus, as will be described later, the magnetic sensor can be reduced in size.

As described above, the magnetic sensor according to the embodiment is mounted while having a GMR-element formed face 11a (where the GMR elements 11 are formed) placed at almost a right angle for the face of the substrate 2 where the GMR chip 1 is mounted. Thus, it is possible to detect the magnetic field in a direction vertical to the mount face of the substrate 2. Therefore, by placing a magnet 7 to face the mount face of the substrate 2 to which the GMR-element formed face 11a is located vertically and by arranging the magnet 7 in such a manner that a magnetic force line (an arrow A) by the magnet 7 comes to be in parallel to the GMR-element formed face 11a as shown in FIG. 10A, the magnetic sensor can be used as a sensor that is capable of detecting changes in the direction of the magnetic force line. Specifically, as shown in FIG. 10B, the magnetic sensor can be formed by being packaged through sealing over the mount face of the substrate 2 with an insulating member 4 such as a resin so as to cover the GMR chip 1 mounted on the substrate 2. In this case, the GMR chip 1 is arranged to face the side face, so that the magnetic sensor comes to have a detection sensitivity for the magnetic field in a direction (direction of arrow A) that is in parallel to the side face shown with reference numeral 41 in FIG. 10B.

Figure 1A:
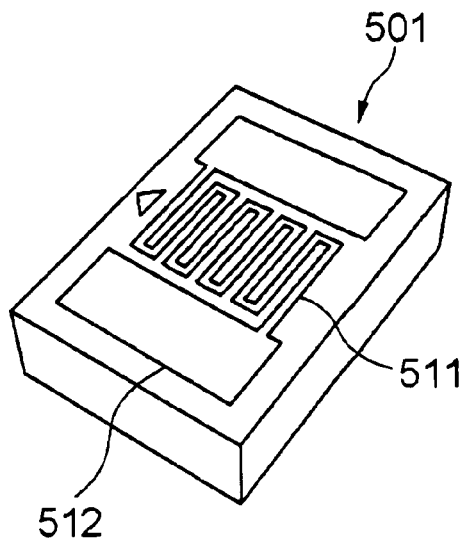
FIG. 1A is a perspective view showing a GMR chip of a conventional case.
Figure 1B:
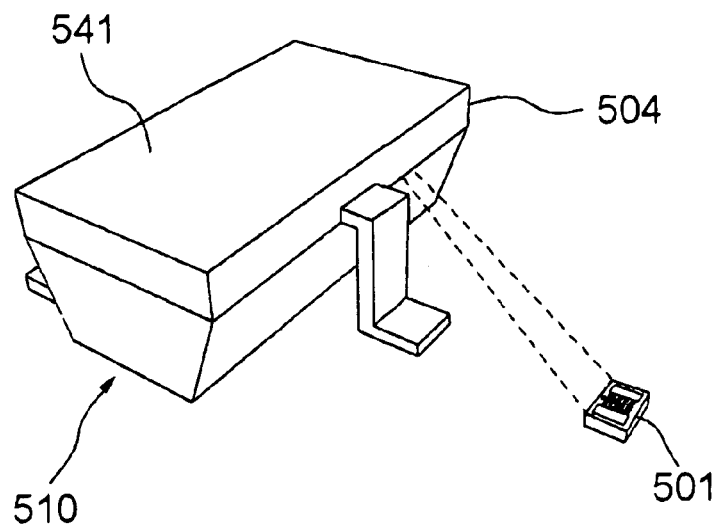
FIG. 1B is a perspective view showing a magnetic sensor using the GMR chip of the conventional case.
Figure 2:
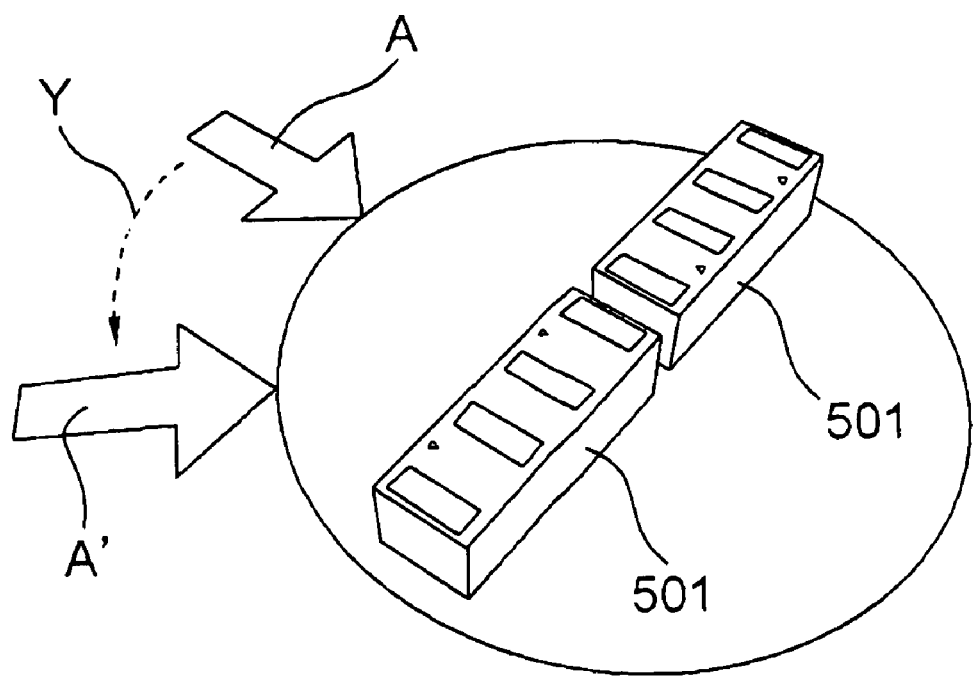
FIG. 2 is an illustration for describing sensitivity directions when detecting a magnetic field by the GMR chips of the conventional case.
Figure 3A:
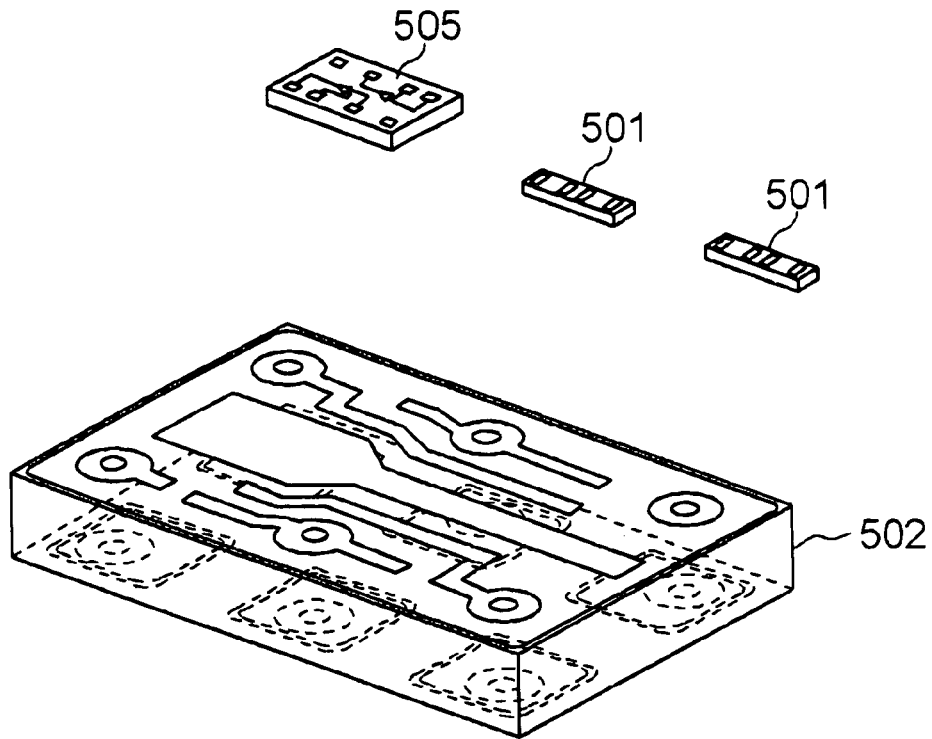
FIG. 3A is an illustration for describing a magnetic sensor manufacturing method according to the conventional case.
Figure 3B:
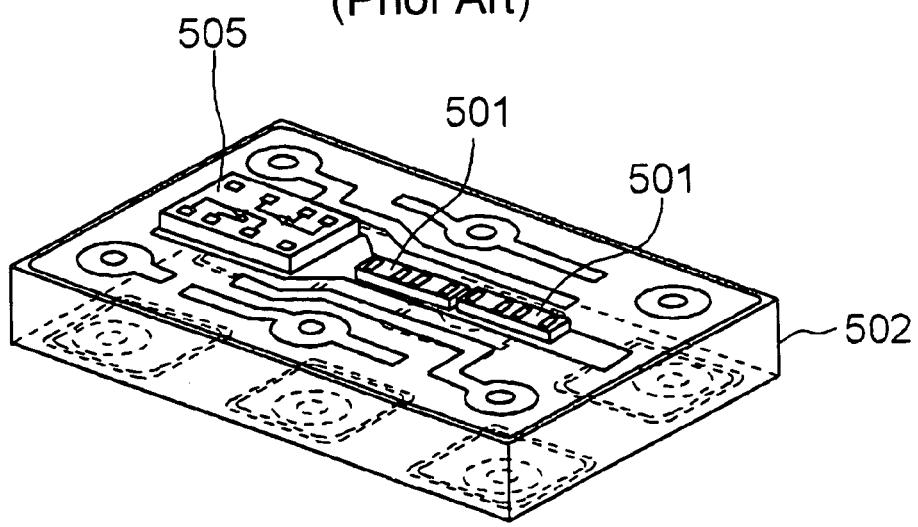
FIG. 3B is an illustration for describing the magnetic sensor manufacturing method according to the conventional case, which is a continuation of FIG. 3A.
Figure 4A:
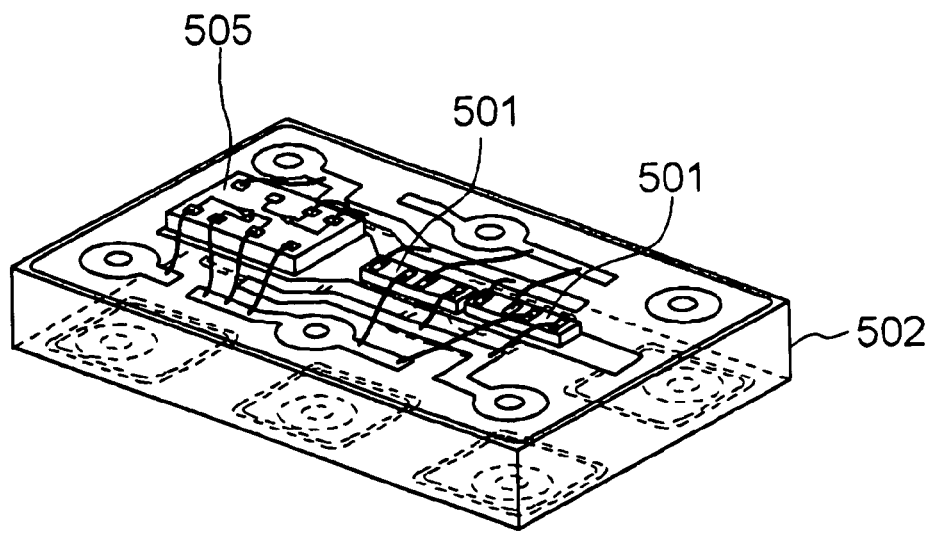
FIG. 4A is an illustration for describing the magnetic sensor manufacturing method according to the conventional case, which is a continuation of FIG. 3B.
Figure 4B:
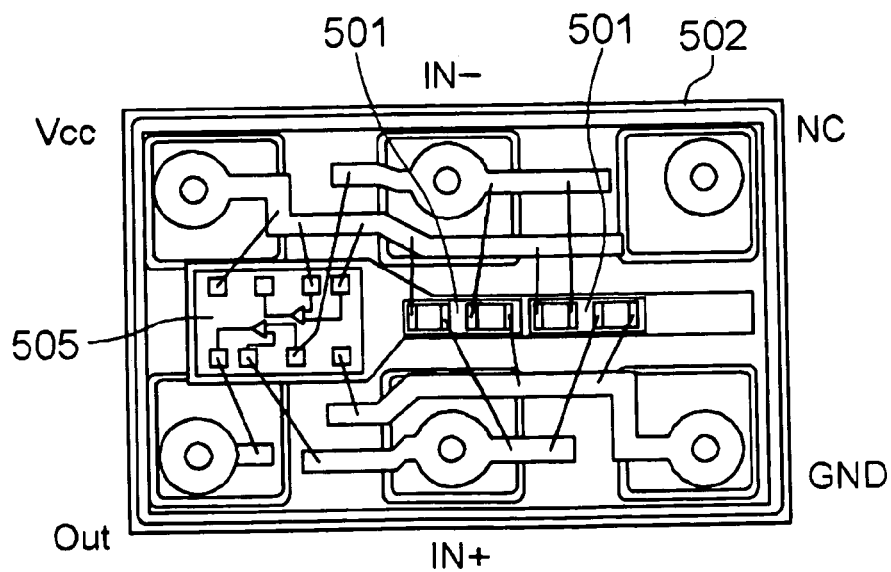
FIG. 4B is a top plan view of the magnetic sensor that is disclosed in FIG. 4A.
Figure 5A:
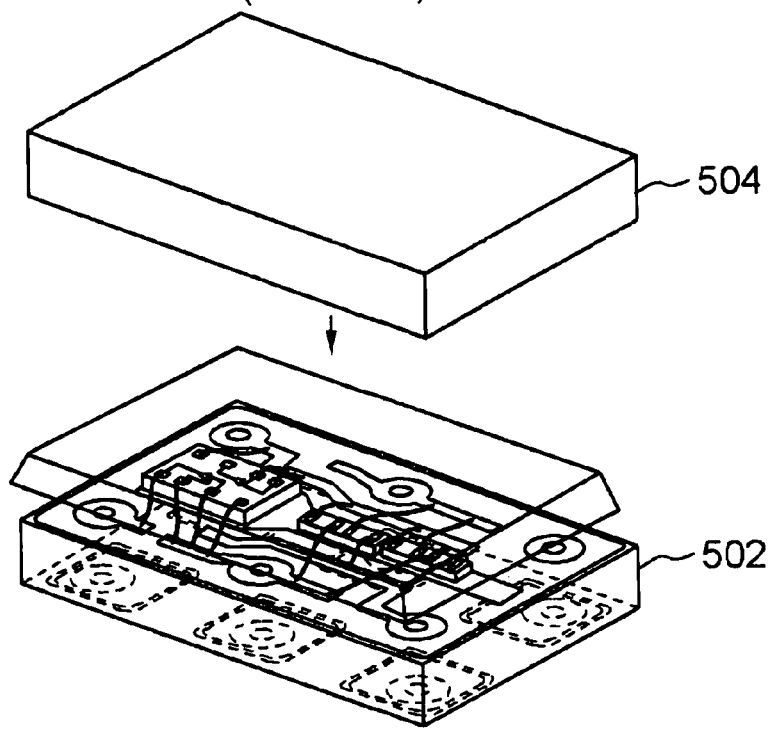
FIG. 5A is an illustration for describing the magnetic sensor manufacturing method according to the conventional case, which is a continuation of FIG. 4A.
Figure 5B:
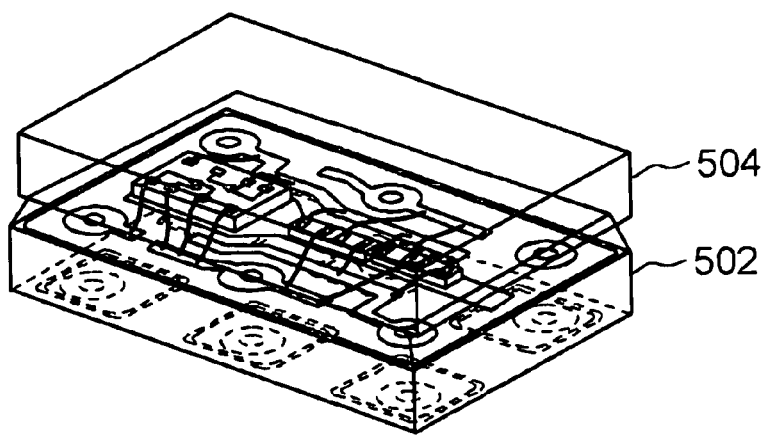
FIG. 5B is an illustration for describing the magnetic sensor manufacturing method according to the conventional case, which is a continuation of FIG. 5A.

Further, detectable directions of the GMR chip will be described by referring to FIG. 11. In an XYZ space shown in FIG. 4, it is to be understood that the substrate is placed along the XY plane, and shown therein is a state where the GMR chip 1 according to the embodiment and the GMR chip 501 according to the conventional case described above are placed on the substrate. The element-formed face of the GMR chip 501 according to the conventional case is in parallel to the XY plane, so that it is capable of detecting the magnetic field in the direction along the XY plane. In the meantime, the element-formed face of the GMR chip 1 according to the embodiment is in parallel to the XZ plane, so that it is capable of detecting the magnetic field in the direction along the XZ plane.

Figure 6A:
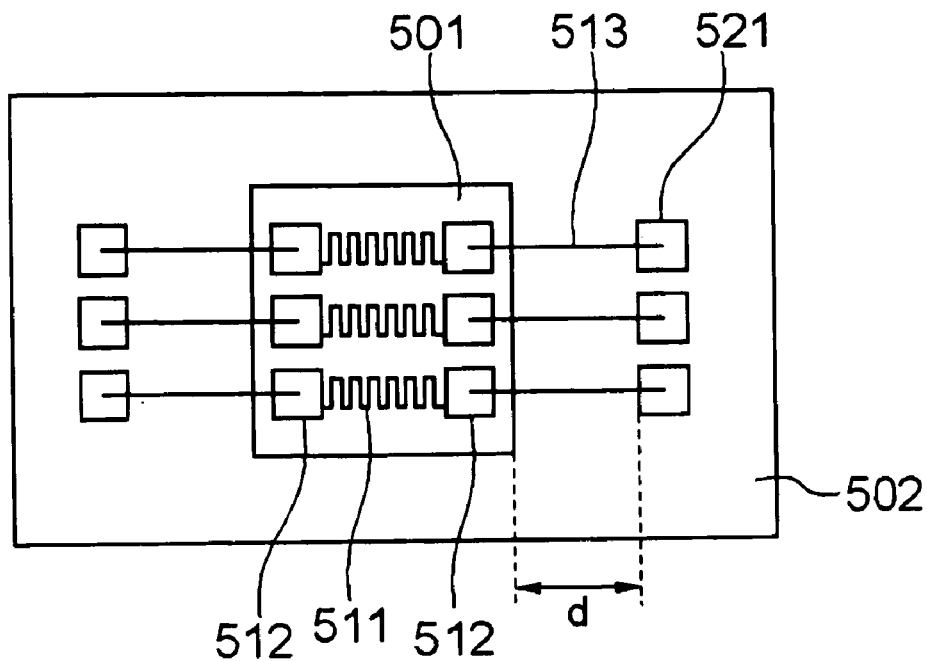
FIG. 6A is a top plan view showing a part of the structure of the magnetic sensor of the conventional case.
Figure 6B:
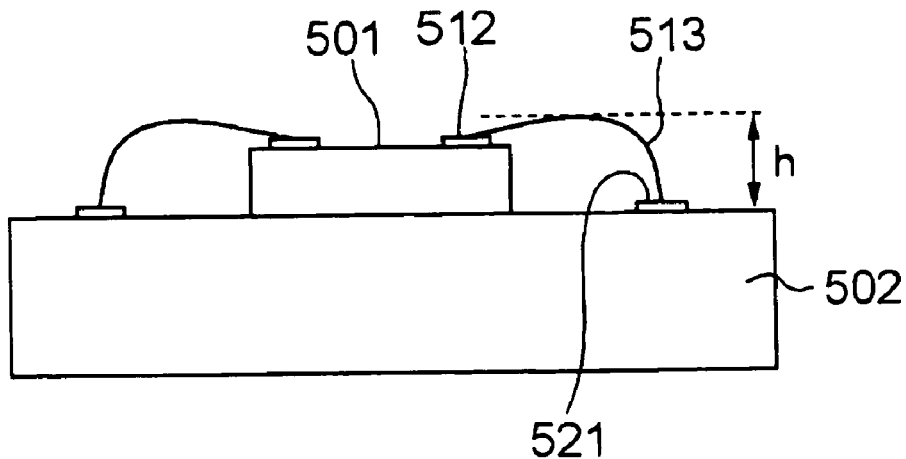
FIG. 6B is a side view showing a part of the structure of the magnetic sensor of the conventional case.
Figure 7:
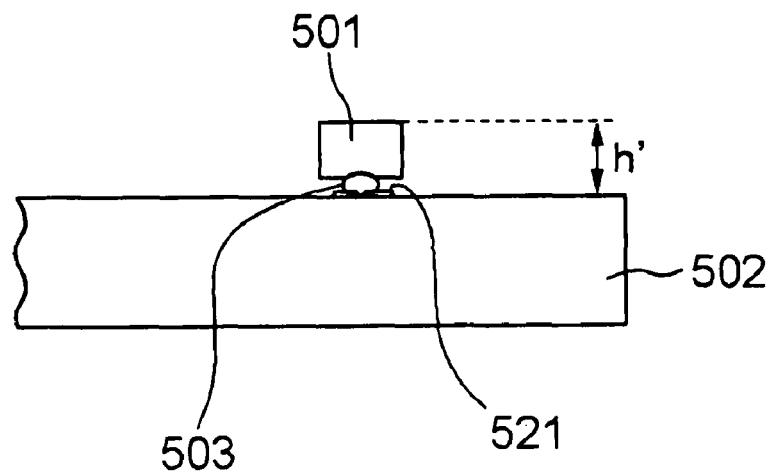
FIG. 7 is a side view showing a part of the structure of the magnetic sensor of the conventional case.
Figure 9B:
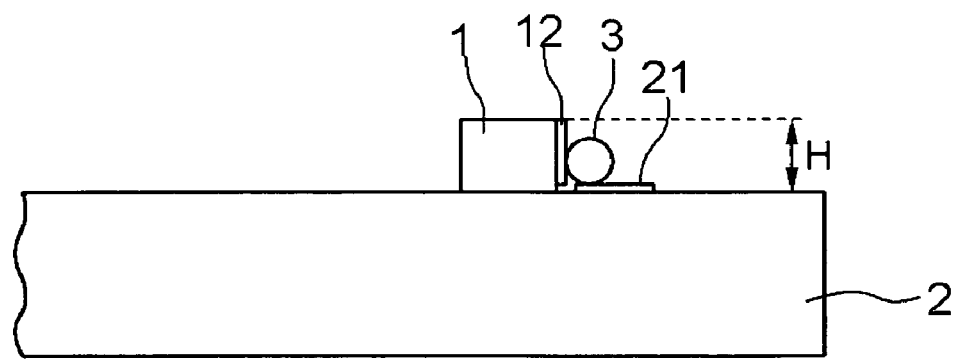
FIG. 9B is a side view of the magnetic sensor that is disclosed in FIG. 8.

As described above, in the magnetic sensor according to the embodiment, the solder ball 3 forming a connection part between the GMR chip 1 and the substrate 2 is located on the side-face side of the GMR chip 1 that is placed vertically to the mount face of the substrate 2. Thus, as shown in FIG. 9B, no other elements (solder ball, wire, etc.) required for connection are not placed in the height direction of the GMR chip 1, so that it is possible to suppress increase in the height H from the substrate 2. Further, as shown in FIG. 9A, distance D between the output terminals 12 of the GMR chip 1 and the connection terminals 21 of the substrate 2 can be made closer, so that the area required for mounting the GMR chip 1 can be suppressed as well. Comparing the magnetic sensor of the embodiment with the conventional magnetic sensor described by referring to FIG. 6A-FIG. 7, the height from the substrate 2 does not exceed the thickness H of the GMR chip 1 with the embodiment, whereas the height from the substrate 502 becomes higher than the height of the GMR chip 501 (codes h, h') with the conventional case because of the gold ball 503 and the wire 513 used for wire bonding for connection, as shown in FIG. 6 and FIG. 7. Further, as shown in FIG. 6A, it is necessary with the conventional case to provide the distance d between the GMR chip 501 and the connection terminals 512 on the substrate 502 to be away from each other by a prescribed distance for keeping the space for the wire 513. However, it is possible with the embodiment to arrange each of the terminals 12 and 21 closely to each other. Through the above, it is possible to reduce the size of the magnetic sensor.

Further, as described above, the formed face of the output terminals 12 of the GMR chip 1 is arranged to be vertical to the substrate 2. Thus, the output terminals 12 and the connection terminals 21 can be arranged by making the distance therebetween still shorter, so that it is possible to connect those terminals with the solder ball 3. For connecting the terminals, it is not limited to employ the ball bonding using the solder balls 3 but may employ ball bonding using the gold balls. Further, the connecting method is not limited only to the ball bonding but other method may be employed as well. In any cases using all sorts of connecting methods, the connecting work becomes easy and the connection state can be made stable since the distance between each of the terminals 12 and 21 as the connection targets becomes close. As a result, manufacture of the magnetic sensors becomes easy, the structural efficiency is improved, and the manufacturing cost can be reduced as well.

The embodiment has been described by referring to the case where the GMR chip 1 mounted on the substrate 2 is arranged in such a manner that the output-terminal formed face 11a comes to be almost vertical to the substrate 2. However, it is not limited only to such case where the output-terminal formed face 11a is arranged to be almost vertical to the substrate 2. It is desirable for the angle between the substrate 2 and the output terminal formed face of the GMR chip 1 to be almost vertical (i.e., approximately 90 degrees), however, it is also possible for the angle to be somewhere between 0 degree and 180 degrees. For example, the output-terminal formed face 11a of the GMR chip 1 may be formed with a prescribed tilt and arranged to have an obtuse angle or an acute angle with the substrate 2, and the output terminals 12 and the connection terminals 21 may be connected by solder balls or the like in that state. In other words, it is fine as long as the connecting device such as the ball bonding or wire bonding used for connecting each of the terminals 12 and 21 does not project towards the height direction of the magnetic sensor by having the formed face of the output terminals 12 of the GMR chip 1 placed not in parallel to the GMR-chip mount face of the substrate 2 and placed not to face in the height direction of the magnetic sensor when the GMR chip 1 is mounted on the substrate 2.

Further, there has been described in the above by referring to the case where the GMR element 11 and a pair of output terminals 12 are formed on the same face of the GMR chip 1. However, those may be formed on different faces from each other. In such case, by arranging the formed face of the output terminals 12 on the side face of the GMR chip 1, i.e., by arranging it on the substrate 2 to be almost vertical to the mount face when being mounted on the substrate 2, connection of those also becomes easy and the space can be saved as described above. However, it is desirable to form the GMR element 11 and the output terminals 12 on the same face for making it easier to manufacture the GMR chip 1 itself and the magnetic sensor, since the GMR element 11 and the output terminals 12 are normally laminated/formed only on a prescribed face of the GMR chip.

This embodiment has been described by referring to the case where the spin-valve type GMR elements are used as the magnetic field detection elements mounted on the GMR chip 1 (magnetic field detection chip) for detecting the magnetic field as the detection target. However, other magnetic field detection elements such as Hall elements and ME elements may also be used.

Second Embodiment

Figure 23:
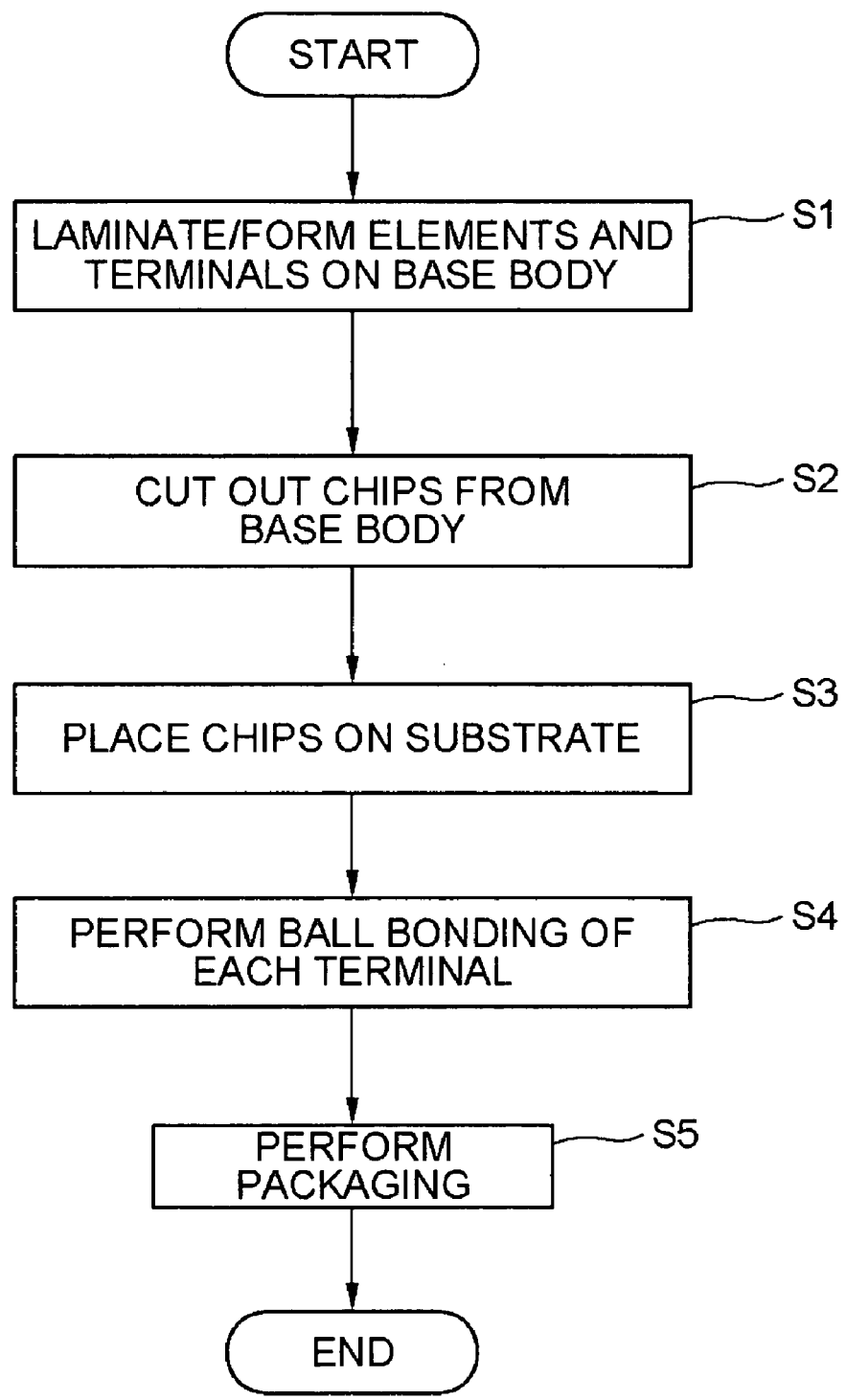
FIG. 23 is a flowchart showing the magnetic sensor manufacturing method according to the second embodiment.

Next, a second embodiment of the present invention will be described by referring to FIG. 12-FIG. 23. FIG. 12-FIG. 14 are illustrations showing the structure of the magnetic sensor according to this embodiment. FIG. 15-FIG. 20 are illustrations for describing modification examples of the magnetic sensor according to the embodiment. FIG. 21-FIG. 23 are illustrations for describing a method for manufacturing the magnetic sensor.

First, the magnetic sensor according to the second embodiment employs almost the same structure as the one shown in FIG. 8 described in the first embodiment. That is, GMR chips 101 and 102, each having two GMR elements formed thereon, are mounted on a substrate 2 so as to constitute the magnetic sensor with four GMR elements in total. Here, the two GMR chips 101, 102 are arranged side by side on the substrate 2 so that the GMR elements A, B, C, D formed on the respective GMR chips 101, 102 are arranged in a straight line form. Further, at this time, each of the GMR chips 101 and 102 is placed to have their top and bottom sides inverted from each other, so that magnetization fixed directions (see arrows in FIG. 12A) of the GMR elements A, B formed on the GMR chip 101 and the GMR elements C, D formed on the GMR chip 102 face in the opposite directions from each other. That is, the formed face of the GMR elements A, B and the formed face of the GMR elements C, D are rotated by 180 degrees from each other to be placed on the respective GMR chips 101, 102. At this time, the formed faces of the four GMR elements A, B, C, and D are arranged on a same straight line, so that each of the GMR elements comes to be located on a same plane.

Figure 12A:
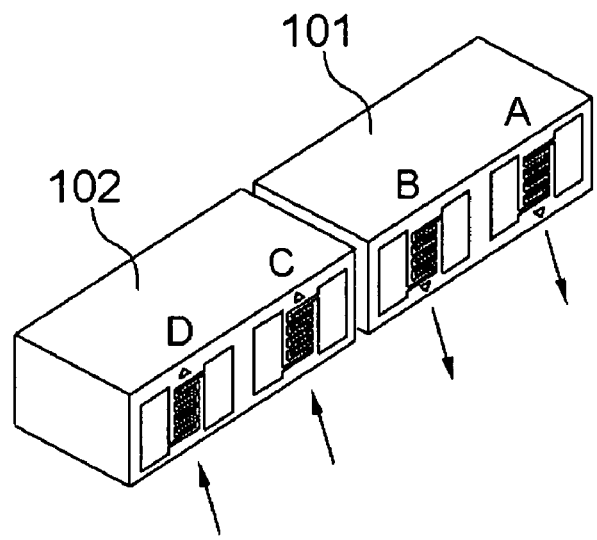
FIG. 12A is an illustration showing layout of the GMR chips according to a second embodiment.
Figure 12B:
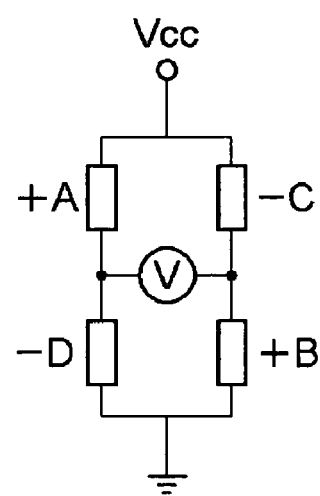
FIG. 12B is an illustration showing a bridge circuit constituted with each GMR element provided on the GMR chips.

In this embodiment, further, the above-described four GMR elements are connected to the connection terminals 21 on the substrate 2. Through this, two each of the GMR elements are connected in series via the wiring of the substrate 2, and the serially connected terminals are connected in parallel to form a bridge circuit. Specifically, as shown in FIG. 12B, the GMR element A formed on the GMR chip 101 and the GMR element D formed on the GMR chip 102 arranged to have the opposite magnetization fixed direction for that of the GMR element A are connected in series. Further, the GMR element B formed on the GMR chip 101 and the GMR element C formed on the GMR chip 102 arranged to have the opposite magnetization fixed direction for that of the GMR element B are connected in series. Then, those serially connected elements are connected in parallel. Furthermore, the substrate 2 is constituted to be able to detect differential voltage V of the bridge circuit (differential voltage detecting device). That is, in the case of FIG. 12B, it is constituted to detect the differential voltage V between the GMR elements A and D that are connected in series, and between the GMR elements C and B that are connected in series as well.

Figure 13A:
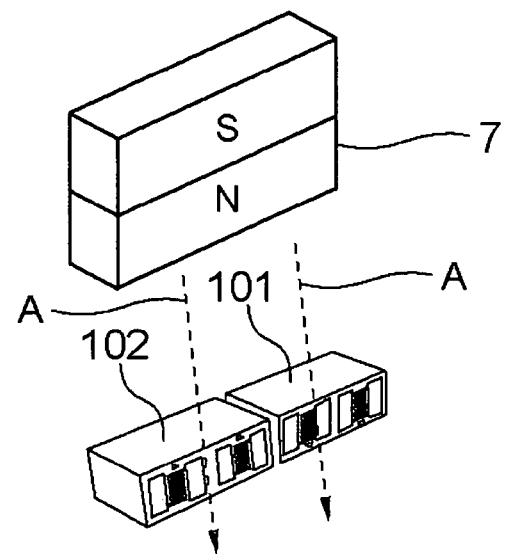
FIG. 13A is an illustration for describing a use state of the magnetic sensor according to the second embodiment.
Figure 13B:
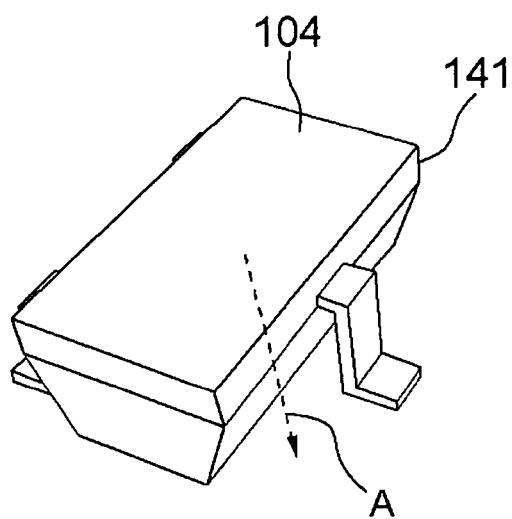
FIG. 13B is an illustration for describing a use state of the magnetic sensor according to the second embodiment.

Then, as shown in FIG. 13A, by placing the magnet 7 in such a manner that the magnetic force line (arrow A) by the magnet 7 becomes in parallel to the respective GMR-element formed faces 11a of the GMR chips 101 and 102 in the above-described layout, i.e., in such a manner that the magnetic force line becomes vertical to the mount face of the substrate, not shown, on which the GMR chips 101 and 102 are mounted, it can be utilized as the magnetic sensor. Specifically, as shown in FIG. 13B, the magnetic sensor is formed by being made into a package through sealing over the mount face of the substrate 2 with an insulating member 104 such as a resin to cover the GMR chips 101 and 102 that are mounted on the substrate 2. In this case, the GMR chips 101 and 102 are arranged to face the side face, so that the magnetic sensor comes to have a detection sensitivity for the magnetic field in a direction (direction of arrow A) that is in parallel to the side face shown with reference numeral 141 in FIG. 13B.

Because the magnetic sensor is constituted in the manner described above, the both faces where the four GMR elements are formed face the same direction along the direction of the magnetic field. Thus, the resistance value of each GMR element changes, when there is a change in the direction of the magnetic field to be the detection target (direction of code A in FIG. 13A and FIG. 13B). Here, as described above, the GMR elements (A, B, C, D) in pairs of two each are set to have the opposite magnetization fixed directions from each other.

Therefore, as shown in FIG. 12B, the resistance values of each GMR elements change to "+" and "−" values. Thereby, a differential voltage is to be generated in the bridge circuit even with a very small change in the magnetic field, so that it becomes possible to detect the direction of the magnetic field with high sensitivity. Further, since the formed faces of each GMR element are located on the same plane, each element can detect the direction of the magnetic field under a same condition. This makes it possible to improve the detection accuracy.

Figure 14A:
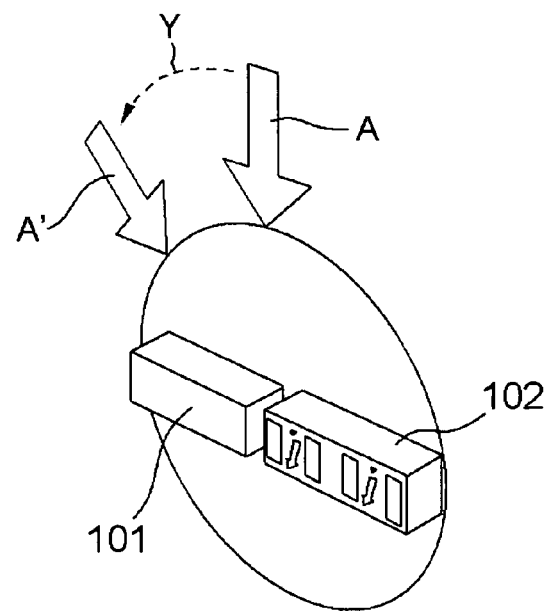
FIG. 14A is an illustration showing a modification example of the layout of the GMR chips according to the second embodiment.
Figure 14B:
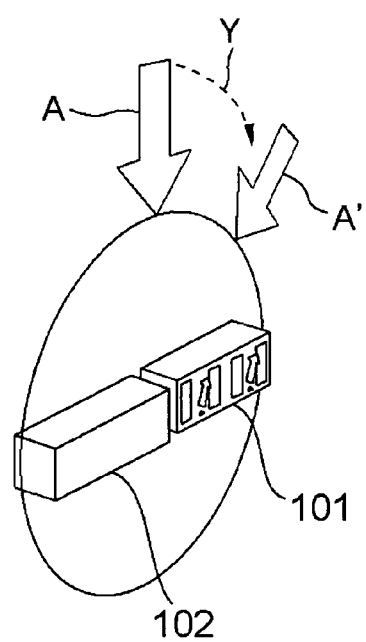
FIG. 14B is an illustration showing the modification example of the layout of the GMR chips according to the second embodiment.

Now, another modification example of the layout of the four GMR elements will be described by referring to FIG. 14-FIG. 20. First, FIG. 14A and FIG. 14B show a case where the two GMR chips 101, 102 shown in FIG. 13A are arranged in such a manner that each of the GMR-element formed faces comes to face in the opposite directions from each other. That is, FIG. 14A and FIG. 14B illustrate the same layout, while FIG. 14A shows a view taken from the GMR-element formed face of the GMR chip 102 side and FIG. 14B shows a view taken from the GMR-element formed face of the GMR chip 101 side. In other words, further, the magnetization fixed directions of the GMR elements of the two GMR chips 101 and 102 shown in FIG. 14A and FIG. 14B are inverted by 180 degrees from each other, and the GMR-element formed faces thereof are arranged to face the opposite directions from each other (front and back sides thereof are inverted from each other).

Then, in the same manner as described above, a bridge circuit is constituted with the four GMR elements of the two GMR chips 101 and 102 as in FIG. 12B. Thus, the GMR elements in pairs (elements A, D in pair, and elements B, C in pair) connected in series with a differential voltage detection point sandwiched therebetween and the GMR elements in pairs (elements A, C in pair, and elements B, D in pair) connected in parallel by having a differential voltage detection device as a boundary are to be arranged while the respective element-formed faces are rotated by 180 degrees from each other. Further, the directions thereof (the front and back sides) are to face the opposite directions. Thereby, shift in the magnetization fixed directions that may be generated during the manufacture of the GMR elements, i.e., shift in the magnetization directions of pin layers, is offset mutually. Therefore, it is possible to eliminate influences of the shift and to detect the change in the magnetic field with still higher accuracy. Furthermore, it is possible even with the above-described layout to place the GMR chips side by side on the same plane of the substrate in a straight line form, so that the space can be saved.

Figure 15A:
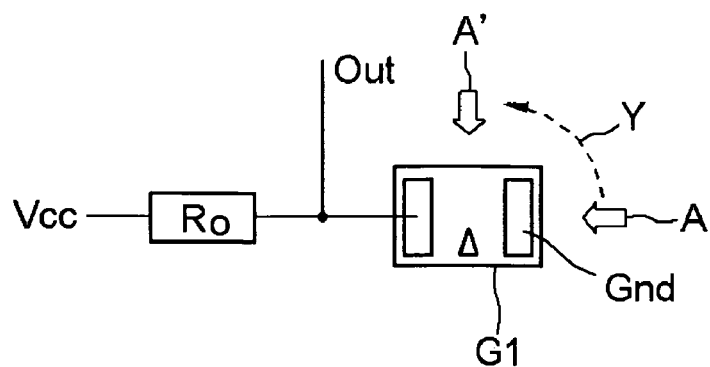
FIG. 15A is an illustration for describing the modification example of the layout of the GMR chips according to the second embodiment.
Figure 15B:
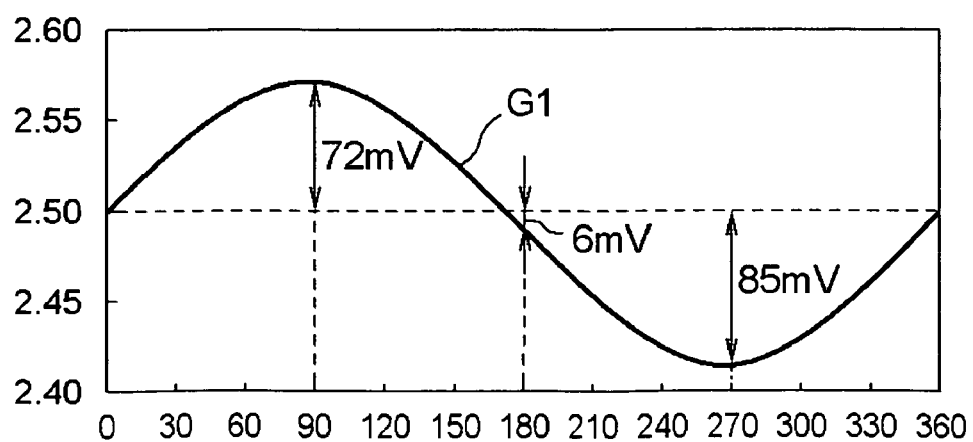
FIG. 15B is an illustration showing a differential voltage in the layout of the GMR chips disclosed in FIG. 15A.

Now, reasons for arranging the GMR chips 101 and 102 in the above-described manner will be described by referring to FIG. 15-FIG. 18. First, as shown in FIG. 15A, a half bridge is formed by connecting a GMR element G1 and a resistance Ro. Here, an applied voltage to the bridge is 5V, and the resistance value of the resistance Ro is the same as the resistance value when there is no magnetic field applied for the GMR element G1. Thus, a midpoint potential (Out) thereof is 2.5V. FIG. 15B shows a change in the midpoint potential when a magnetic field whose direction changes from the code A to the code A' as illustrated with an arrow Y is applied to the GMR element G1. Upon this, because of characteristics of the GMR element due to the shift in the magnetization directions of the pin layers generated at the time of manufacture, the values at 90 degrees and 270 degrees become asymmetrical, and there is shift in the value from 2.5V at 180 degrees as shown in the drawing. In order to correct such shift, a bridge is formed by combining a plurality of sets of GMR elements as will be described hereinafter.

Figure 16A:
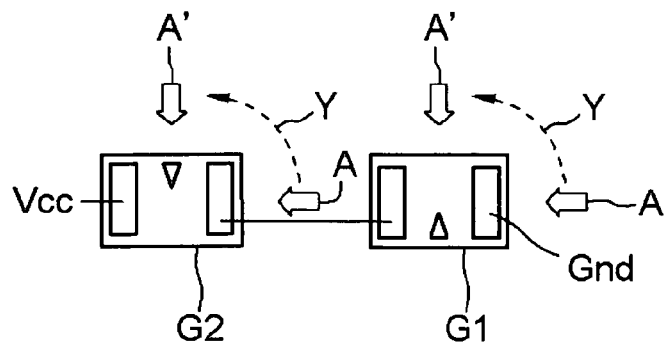
FIG. 16A is an illustration for describing a modification example of the layout of the GMR chips according to the second embodiment.
Figure 16B:
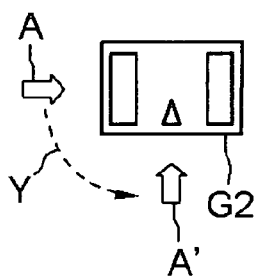
FIG. 16B is an illustration for describing the layout of the GMR chips shown in FIG. 16A.
Figure 16C:
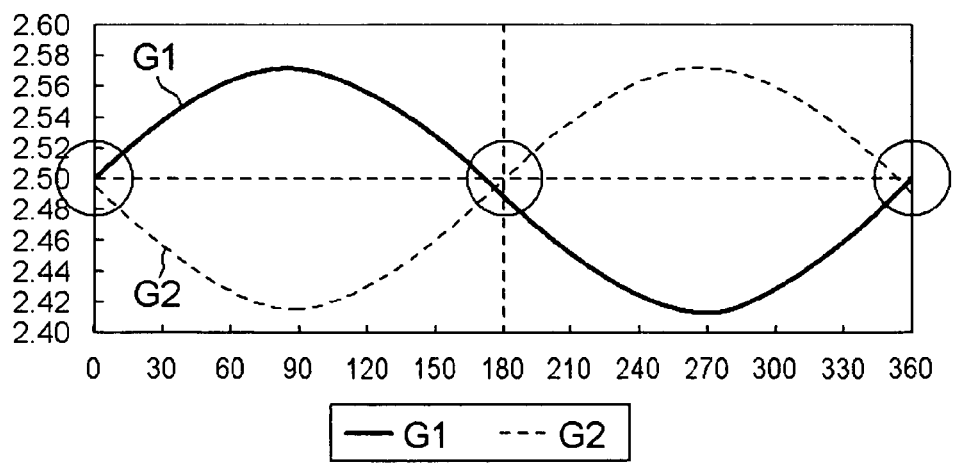
FIG. 16C is an illustration showing a differential voltage in the layout of the GMR chips disclosed in FIG. 16A.

Next, as shown in FIG. 16A, there is considered a case where two GMR elements G1, G2 are connected in series, and another pair of those is connected in parallel to that pair to form a bridge circuit. In this case, the GMR element G2 is arranged along the element-formed face by being rotated by 180 degrees from the GMR element G1. Thereby, the magnetic field in the direction shifted by 180 degrees is to be applied to the GMR element G2 as shown in FIG. 16B. Thus, when a midpoint potential is outputted from the same structure as that of FIG. 15A, there is obtained the midpoint potential having an inverted phase from that of the GMR element G1, as shown in FIG. 16C. However, as shown in the graph, there is shift generated in the midpoint potentials by the GMR element G2 at 0 degree, 180 degrees, and 360 degrees. Therefore, there is also shift generated in the differential voltage even in the bridge circuit that is formed by connecting the two GMR elements G1 and G2 as shown in FIG. 16A. For example, there is such shift generated at 0 degrees that the differential voltage does not become 0V, which may result in deteriorating the detection accuracy.

Figure 17A:
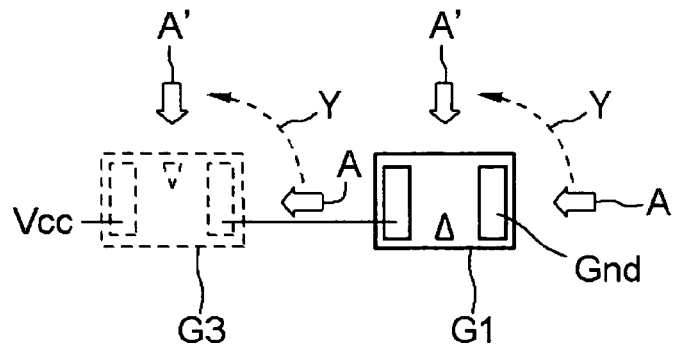
FIG. 17A is an illustration for describing a modification example of the layout of the GMR chips according to the second embodiment.
Figure 17B:
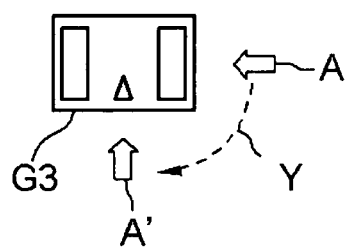
FIG. 17B is an illustration for describing the layout of the GMR chips shown in FIG. 17A.
Figure 17C:
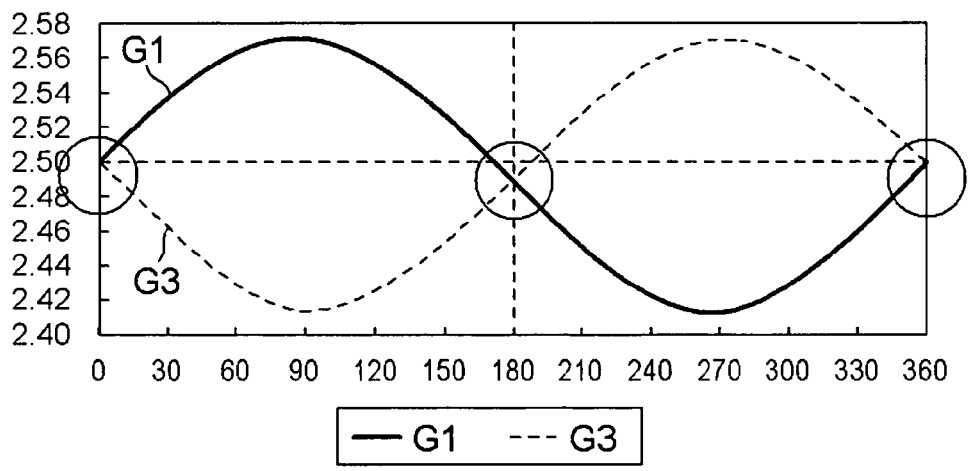
FIG. 17C is an illustration showing a differential voltage in the layout of the GMR chips disclosed in FIG. 17A.

Next, as shown in FIG. 17A, there is considered a case where two GMR elements G1, G3 are connected in series, and another pair of those is connected in parallel to that pair to form a bridge circuit. In this case, the GMR element G3 is arranged along the element-formed face by being rotated by 180 degrees from the GMR element G1, and its element-formed face is arranged to face the opposite direction. That is, the GMR element G3 is arranged with its front and back sides inverted from those of the GMR element G2 that is shown in FIG. 16A. Thereby, the magnetic field in the direction that is rotated inversely from the magnetic field for the GMR element G1 is to be applied to the GMR element G3 as shown in FIG. 17B. Thus, when a midpoint potential is outputted from the same structure as that of FIG. 15A, there is obtained the midpoint potential that is inversely rotated from that of the GMR element G1, as shown in FIG. 17C. Therefore, the midpoint potentials by the GMR element G3 at 0 degree, 180 degrees, and 360 degrees are consistent with the midpoint potentials of the GMR element G1. Thus, there is no shift generated in the differential voltage in the bridge circuit that is formed by connecting the two GMR elements G1 and G3 as shown in FIG. 17A. For example, in the bridge circuit shown in FIG. 12B, the GMR elements are arranged at the codes A, B with the direction of G1, and the GMR elements are arranged at the codes C, D with the direction of G3.

FIG. 18 shows the midpoint potential of the GMR element G2 shown in FIG. 16C and the midpoint potential of the GMR element G3 shown in FIG. 17C on same graphs. Specifically, there are enlarged views taken at 0 degree, 180 degrees, and 360 degrees. As shown in the graphs, it is obvious that the midpoint potentials of each of the GMR elements G2 and G3 are different. As described above, the midpoint potential of the GMR element G3 is consistent with the midpoint potential of the GMR element G1 at 0 degree, 180 degrees, and 360 degrees.

As described above, it is possible to offset the shift in the magnetization fixed directions, i.e., the magnetization directions of the pin layers, which may be generated at the time of manufacturing the GMR elements more securely by constituting the bridge circuit through arranging the two GMR chips 101, 102 in such a manner that the respective GMR-element formed faces are rotated by 180 degrees from each other and are to face in the opposite directions from each other. As a result, it becomes possible to eliminate the influences of the shift and to detect the changes in the magnetic field with high accuracy.

Figure 19A:
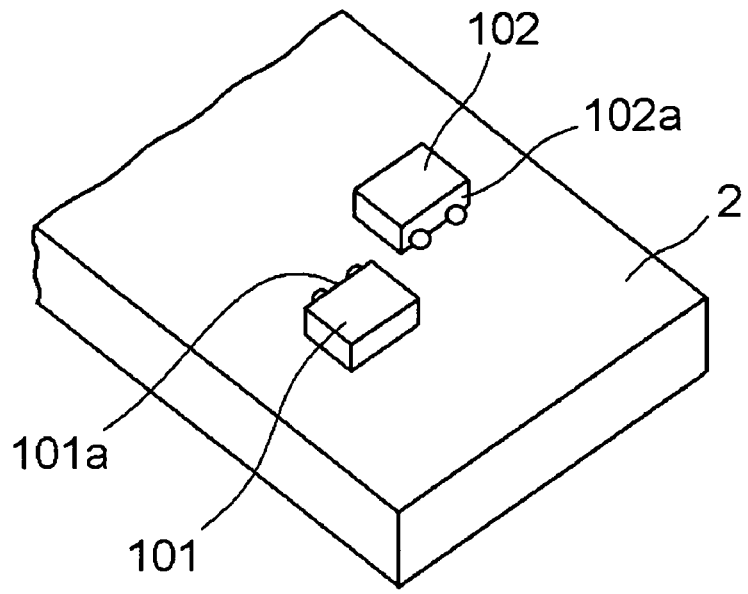
FIG. 19A is an illustration showing a modification example of the layout of the GMR chips according to the second embodiment.
Figure 19B:
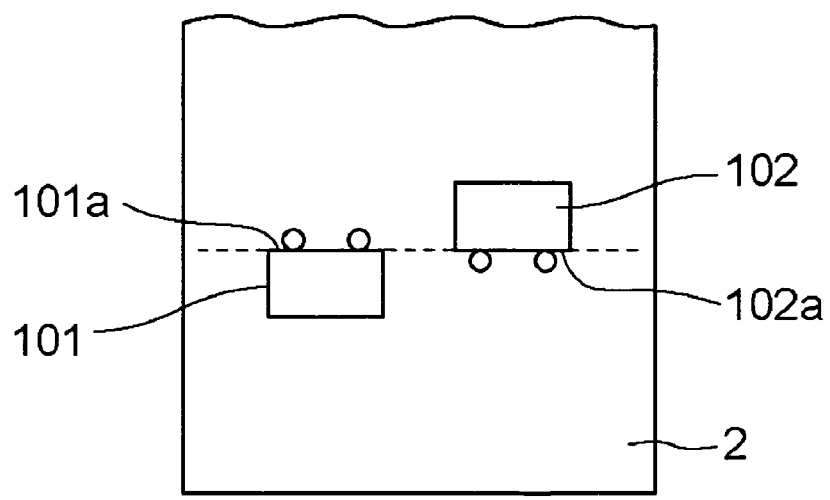
FIG. 19B is a top plan view of the GMR chip disclosed in FIG. 19A.

In this case, as shown in FIG. 19A and FIG. 19B, it is preferable to arrange the GMR chips 101, 102 on the substrate 2 in such a manner that both of GMR-element formed faces 101a, 102a of the two GMR chips 101, 102 are located on a same straight line (on dotted line of FIG. 19B), i.e., in such a manner that the element-formed faces themselves are located on a same plane. FIG. 19A is a perspective view showing a state where the GMR chips 101 and 102 are arranged on the substrate 2, and FIG. 19B is a top plan view thereof. As described above, this makes it possible to detect the changes on the magnetic field with high accuracy by eliminating the influences of the shift in the pin magnetic field of the GMR elements and to detect the changes in the magnetic fields working on the same plane simultaneously with all the GMR elements. Therefore, the detection accuracy can be improved further. In addition, it is possible to achieve the above-described structure on a single substrate and to suppress the height when mounted on the GMR chips. Therefore, the sensor can be reduced in size.

Figure 20A:
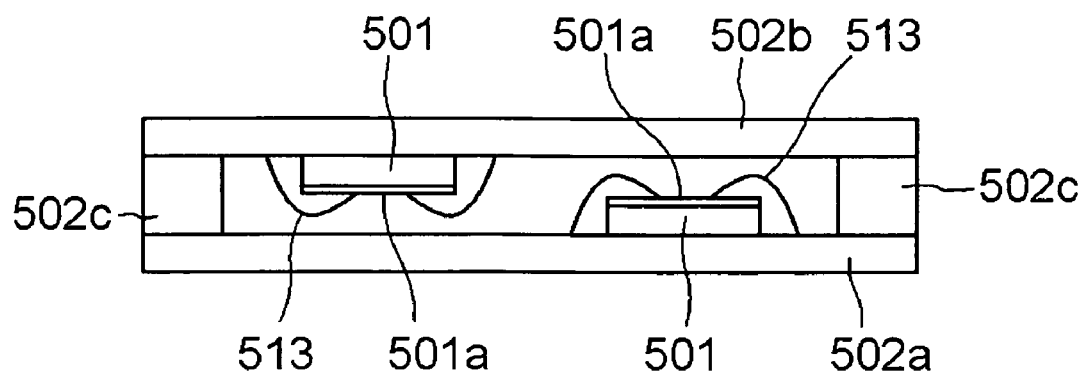
FIG. 20A is an illustration for comparing the conventional case with the modification example of the layout of the GMR chips according to the second embodiment.
Figure 20B:
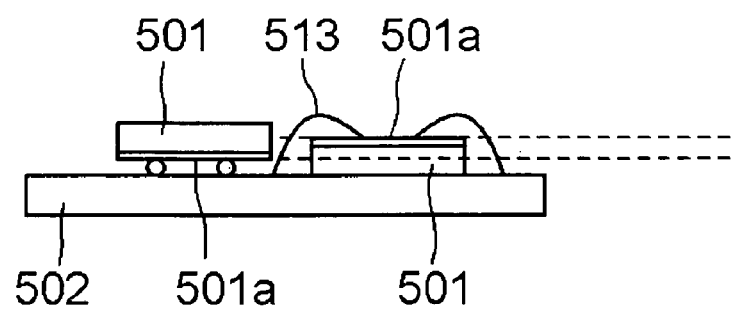
FIG. 20B is an illustration for comparing the conventional case with the modification example of the layout of the GMR chips according to the second embodiment.

Now, by referring to FIG. 20A and FIG. 20B, described are examples of a case where the layout of the above-described GMR chips 101 and 102 according to the embodiment shown in FIG. 19A and FIG. 19B are achieved by a conventionally used method. First, in the case of FIG. 20A, a pair of opposing substrates 502a, 502b are provided with a space provided therebetween with a spacer 502c or the like, and GMR chips 501 are provided between each of the substrates 502a and 502b by wire bonding. However, in this case, two substrates are required. Further, an element-formed face 501a of each chip 501 is arranged towards the height direction, so that the thickness in the height direction is increased for the thickness of the substrates and the wire 513. In the case of FIG. 20B, it can be constituted with a single substrate by employing GGI for bonding the chip 501 and employing wire bonding 513 for bonding the other chip 501 and by making the facing directions of the element-formed faces 501a of each chip 501 opposite from each other. However, the positions of each of the element-formed faces 501a cannot be made uniform (see dotted lines). Further, the thickness in the height direction cannot be suppressed because of the existence of the wire and the gold balls. Therefore, as described above, the structure of the present invention where the element-formed faces of the GMR chips 501 are arranged vertically to the substrate is extremely effective for reducing the size of the sensor.

Figure 21A:
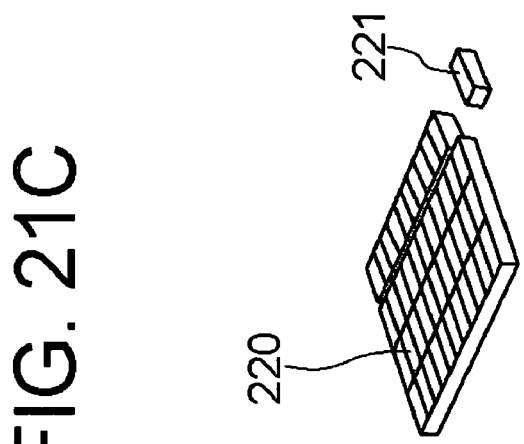
FIG. 21A is an illustration for describing a manufacturing method of the GMR chips that constitute the magnetic sensor according to the second embodiment.
Figure 21B:
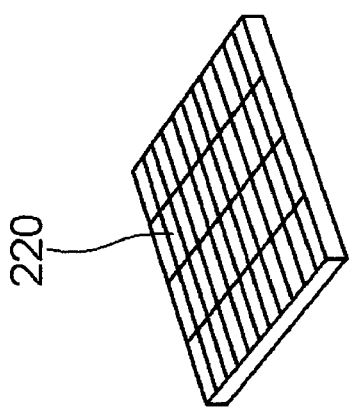
FIG. 21B is an illustration for describing the manufacturing method of the GMR chips that constitute the magnetic sensor according to the second embodiment.
Figure 21C:
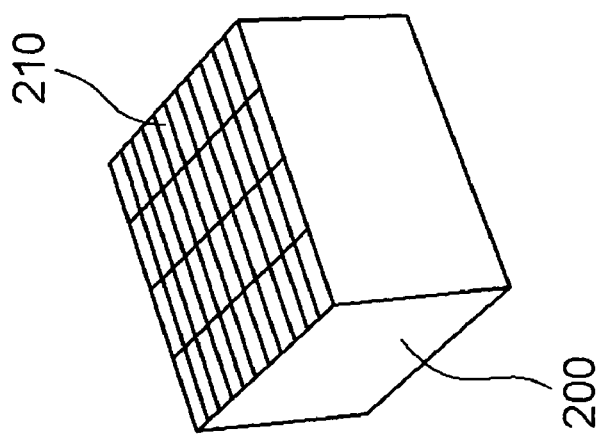
FIG. 21C is an illustration for describing the manufacturing method of the GMR chips that constitute the magnetic sensor according to the second embodiment.

Subsequently, a method for manufacturing the above-described magnetic sensor will be described by referring to FIG. 21-FIG. 23. First, a method for manufacturing a GMT chip 1 will be described (magnetic field detection chip manufacturing step). First, as shown in FIG. 21A, a plurality of sets of GMR elements and pairs of output terminals are laminated/formed on a wafer block 200 (base body) that is cut out from a wafer (step S1 of FIG. 23). Then, as shown in FIG. 21B, an element-formed face 210 side of the wafer block 200 is cut out in a prescribed thickness to form an element-formed plate 220. Thereafter, as shown in FIG. 21C, a GMR chip 221 including at least one set of GMR element and output terminals as a pair is cut out from the element-formed plate 220 (step S2 of FIG. 23).

Subsequently, the cutout GMR chips are placed on the substrate (see FIG. 8). Here, as shown in FIG. 22, two GMR chips 101 and 102 formed closely to each other are cut out from a single element-formed plate 220 on which a plurality of GMR elements are formed. Then, as shown in FIG. 12A, the GMR chips 101 and 102 are arranged on the substrate 2 in such a manner that each GMR element lines in a straight line form (step S3 of FIG. 23), and connection terminals on the substrate 102 and the output terminals of the GMR chips 101, 102 are connected by ball bonding using solder balls or the like to form a bridge circuit (step S4 of FIG. 23). Through this, the GMR chips 101 and 102 are mounted on the substrate (magnetic field detection chip mounting step). In step S3, it is also possible to arrange the chips 101, 102 in such a manner that the respective GMR-element formed faces of the GMR chips 101, 102 are rotated by 180 degrees from each other, and that those are located on the opposite side from each other as shown in FIG. 14A and FIG. 19A.

After mounting the GMR chips 101, 102 on the substrate, the GMR-chip mount face of the substrate, i.e., the GMR chips 101, 102 themselves, are covered by an insulating member such as a resin to be formed in to a package as a magnetic sensor (step S5 of FIG. 23, packaging step). Thereby, the magnetic sensor can be manufactured.

As the GMR element, this embodiment uses a spin-valve type GMR element having a pin layer whose magnetization direction is fixed and a free layer whose magnetization direction can be changed freely, in order to detect the changes in the direction of the magnetic field with high accuracy. With such spin-valve type GMR elements, it is possible to have shift generated in the magnetization directions of the pin layers in a manufacture process when laminating/forming those elements. Therefore, when those elements are formed into a bridge circuit to be used as a magnetic sensor, a prescribed output value may be outputted from each GMR element even if there is no change in the magnetic field. This may become an obstacle for achieving highly accurate detection of the magnetic field. Under such circumstances, it is considered that the shift amount in the magnetization directions of the pin layers is small because the GMR elements formed closely on a single element-formed plate 220 are under almost the same manufacture condition. Therefore, as described above by referring to FIG. 22, by cutting out the GMR chips 101, 102 formed closely on the single element-formed plate 220 and forming a bridge circuit in such a manner that the magnetization fixed directions of the GMR elements come to be in the state as illustrated with arrows in FIG. 12A or to be opposite from each other as shown in FIG. 14A, the shift in the magnetization directions of the pin layers can be offset mutually. Thereby, it is possible to detect the changes in the magnetic field with high accuracy by eliminating the influences of the shift.

The magnetic sensor according to the present invention can be utilized as an azimuth sensor for detecting geomagnetism that is a minute magnetic field, to a magnetic encoder, and the like. Therefore, the magnetic sensor according to the present invention has industrial applicability.

What is claimed is:

1. A magnetic sensor, comprising:
   at least one magnetic field detection chip having a magnetic field detection element for detecting a magnetic field and an output terminal for outputting an output signal from said magnetic field detection element; and
   a substrate that has said at least one magnetic field detection chip mounted thereon, and has a connection terminal for being connected to said output terminal of said at least one magnetic field detection chip that is formed on a mount face of said substrate, wherein
   said at least one magnetic field detection chip is mounted on said substrate in such a manner that an output-terminal formed face of said at least one magnetic field detection chip does not become parallel to said mount face of said substrate.

2. The magnetic sensor according to claim 1, wherein said at least one magnetic field detection chip is mounted on said substrate in such a manner that said output-terminal formed face of said at least one magnetic field detection chip becomes almost vertical to said mount face of said substrate.

3. The magnetic sensor according to claim 2, wherein said at least one magnetic field detection chip has said magnetic field detection element formed on said output-terminal formed face of said at least one magnetic field detection chip.

4. The magnetic sensor according to claim 2, wherein said at least one magnetic field detection chip is mounted by being abutted against said substrate.

5. The magnetic sensor according to claim 2, wherein said at least one magnetic field detection chip is mounted on said substrate in such a manner that said output terminal and said connection terminal are located closely from each other.

6. The magnetic sensor according to claim 2, wherein said output and connection terminals are connected by ball bonding.

7. The magnetic sensor according to claim 2, wherein said magnetic field detection element is a spin-valve type magnetoresistive element.

8. The magnetic sensor according to claim 2, comprising:
   a bridge circuit formed by connecting a plurality of magnetic field detection elements that are magnetoresistive elements; and
   a differential voltage detecting device for detecting a differential voltage in said bridge circuit.

9. The magnetic sensor according to claim 8, wherein a plurality of magnetic field detection chips are mounted on said substrate in such a manner that said magnetic field detection chips each have one said magnetic field detection element for forming said bridge circuit are arranged linearly.

10. The magnetic sensor according to claim 8, wherein a plurality of magnetic field detection chips are mounted on said substrate in such a manner that said plurality of magnetic field detection elements for forming said bridge circuit are coplanar.

11. The magnetic sensor according to claim 8, wherein a plurality of magnetic field detection chips are mounted on said substrate in such a manner that formed faces of each of said magnetic field detection elements connected in pairs to detect said differential voltage in said bridge circuit are to face in directions rotated by 180 degrees from each other along said formed faces.

12. The magnetic sensor according to claim 11, wherein said magnetic field detection chips are mounted on said substrate in such a manner that said formed faces of each of said magnetic field detection elements connected in pairs to detect said differential voltage in said bridge circuit are to face in opposite directions from each other.

13. The magnetic sensor according to claim 8, wherein said plurality of magnetic field detection elements constituting said bridge circuit are formed on a same base body where said plurality of magnetic field detection elements are formed.

14. The magnetic sensor according to claim 13, wherein said plurality of magnetic field detection elements constituting said bridge circuit are formed closely to each other on said same base body.

15. A magnetic sensor manufacturing method, the method comprising:
   forming a magnetic field detection element for detecting a magnetic field and an output terminal for outputting an output signal from said magnetic field detection element on a base body, and cutting out a magnetic field detection chip having said magnetic field detection element and said output terminal from said base body;
   mounting said magnetic field detection chip on a mount face of a substrate where a connection terminal is formed, and connecting said output terminal and said connection terminal electrically; and covering, with an insulating member, said mount face of said substrate on which said magnetic field detection chip is mounted, wherein said magnetic field detection chip is mounted on said substrate in such a manner that an output-terminal formed face of said magnetic field detection chip does not become parallel to said mount face of said substrate.

16. The magnetic sensor manufacturing method according to claim 15, wherein said magnetic field detection chip is mounted on said substrate in such a manner that said output-terminal formed face of said magnetic field detection chip becomes almost vertical to said mount face of said substrate.

17. The magnetic sensor manufacturing method according to claim 16, wherein said magnetic field detection chip is mounted on said substrate by arranging said output terminal and said connection terminal closely from each other.

18. The magnetic sensor manufacturing method according to claim 16, wherein said output terminal and said connection terminal are connected by ball bonding.

19. The magnetic sensor manufacturing method according to claim 16, wherein a bridge circuit for detecting a differential voltage is formed by connecting a plurality of magnetic field detection elements that are magnetoresistive elements.

20. The magnetic sensor manufacturing method according to claim 19, wherein a plurality of magnetic field detection chips are mounted on said substrate in such a manner that said magnetic field detection chips each have one said magnetic field detection element for forming said bridge circuit are arranged linearly.

21. The magnetic sensor manufacturing method according to claim 19, wherein a plurality of magnetic field detection chips are mounted on said substrate in such a manner that said magnetic field detection elements for forming said bridge circuit are coplanar.

22. The magnetic sensor manufacturing method according to claim 19, wherein a plurality of magnetic field detection chips are mounted on said substrate in such a manner that formed faces of each of said magnetic field detection elements connected in pairs to detect said differential voltage in said bridge circuit are to face in directions rotated by 180 degrees from each other along said formed faces.

23. The magnetic sensor manufacturing method according to claim 22, wherein said magnetic field detection chips are mounted on said substrate in such a manner that said formed faces of each of said magnetic field detection elements connected in pairs to detect said differential voltage in said bridge circuit are to face in opposite directions from each other.

24. The magnetic sensor manufacturing method according to claim 19, wherein said bridge circuit is formed by using said plurality of magnetic field detection elements that are formed on a common base body in said magnetic field detection chip manufacturing step.

25. The magnetic sensor manufacturing method according to claim 24, wherein said bridge circuit is formed by using said plurality of magnetic field detection elements that are formed closely on said same base body in said magnetic field detection chip manufacturing.

* * * * *